United States Patent
Verhulst et al.

(10) Patent No.: US 9,618,555 B2
(45) Date of Patent: *Apr. 11, 2017

(54) SYSTEM AND METHOD FOR IMPEDANCE MEASUREMENT USING CHIRP SIGNAL INJECTION

(71) Applicants: Huntington Ingalls, Inc., Newport News, VA (US); Virginia Tech Intellectual Properties, Inc., Blacksburg, VA (US)

(72) Inventors: Jacob Verhulst, Newport News, VA (US); Mohamed Belkhayat, Annandale, VA (US); Zhiyu Shen, Blacksburg, VA (US); Marko Jaksic, Blacksburg, VA (US); Paolo Mattavelli, Blacksburg, VA (US); Dushan Boroyevich, Blacksburg, VA (US)

(73) Assignees: Huntington Ingalls Incorporated, Newport News, VA (US); Virginia Tech Intellectual Properties, Inc., Blacksburg, VA (US)

( * ) Notice: Subject to any disclaimer, the term of this patent is extended or adjusted under 35 U.S.C. 154(b) by 678 days.

This patent is subject to a terminal disclaimer.

(21) Appl. No.: 13/953,981

(22) Filed: Jul. 30, 2013

(65) Prior Publication Data
US 2014/0032147 A1    Jan. 30, 2014

Related U.S. Application Data

(60) Provisional application No. 61/677,256, filed on Jul. 30, 2012, provisional application No. 61/677,271, filed on Jul. 30, 2012.

(51) Int. Cl.
*G01R 25/00*    (2006.01)
*G01R 29/26*    (2006.01)
(Continued)

(52) U.S. Cl.
CPC ............. *G01R 29/26* (2013.01); *G01R 27/02* (2013.01); *G01R 27/16* (2013.01)

(58) Field of Classification Search
CPC ......... G01R 29/26; G01R 27/02; G01R 27/16
(Continued)

(56) References Cited

U.S. PATENT DOCUMENTS

2012/0007583 A1*  1/2012  Martens ............. G01R 31/3163
324/76.39

OTHER PUBLICATIONS

Zhiyu Shen et al., *Design and Implementation of Three-phase AC Impedance Measurement Unit (IMU) with Series and Shunt Injection*, 2012 IEEE Applied Power Electronics Conference and Exposition—APEC 2012, pp. 1-8, Feb. 2012.
(Continued)

*Primary Examiner* — Jonathan C Teixeria Moffat
*Assistant Examiner* — Xiuquin Sun
(74) *Attorney, Agent, or Firm* — Hunton & Williams LLP

(57) ABSTRACT

A method for impedance measurement using chirp signal injection is provided. The method includes injecting at least one chirp signal into the three-phase AC system, and collecting at least one response to the at least one chirp signal. The method further includes transferring the at least one response from abc coordinates to dq coordinates. At least one impedance is calculated based on the at least one response to the at least one chirp signal.

22 Claims, 22 Drawing Sheets

(51) Int. Cl.
  *G01R 27/02* (2006.01)
  *G01R 27/16* (2006.01)
(58) Field of Classification Search
  USPC .......................................................... 702/65
  See application file for complete search history.

(56) References Cited

OTHER PUBLICATIONS

Zhiyu Shen et al., *Three-phase AC System Impedance Measurement Unit (IMU) using Chirp Signal Injection*, 2012 IEEE Applied Power Electronics Conference and Exposition—APEC 2012, pp. 1-9, Feb. 2012.

\* cited by examiner

SYSTEM AND METHOD FOR IMPEDANCE
MEASUREMENT USING CHIRP SIGNAL
INJECTION

PRIORITY

This application claims the benefit of U.S. Provisional Application No. 61/677,256, filed Jul. 30, 2012, and U.S. Provisional Application No. 61/677,271, filed Jul. 30, 2012, both of which are incorporated by reference herein in their entirety for any purpose.

TECHNICAL FIELD

The present disclosure relates generally to systems and methods for impedance measurement and, more particularly, to systems and methods for impedance measurement using chirp signal injection.

BACKGROUND

The identification and subsequent measurement of source and load impedances are useful tools for assessing and evaluating stability of electrical power systems. The impedance of an alternating current (AC) electrical system may be measured by injecting a perturbation signal in the direct and quadrature (dq) reference frame of the system, and measuring the voltage and current response to the perturbation.

Problems arise in conventional impedance measurement methods, including low signal-to-noise ratio (SNR) and the presence of background noise, which can prevent accurate measurement. One conventional method to improve SNR is to increase the magnitude and power of the injected perturbation so that the resulting system voltage and current responses are larger compared to the background noise. However, there is a practical limit to increasing the injected perturbation before it noticeably affects and alters the operating point of the system being measured. Because of this, injected perturbation signals are typically small, such as on the order of 5% of the power level that the system is operating at during the measurement. Other methods for improving SNR include decreasing the frequency span (which increases the spectral density) and averaging of data taken over a longer span of time. Both of these methods, however, increase the overall measurement time and decrease accuracy due to an increased chance for system frequency drift during the measurement. Frequency drift during impedance measurement strongly affects measurement accuracy in conventional impedance measurement systems.

For online impedance measurements in three-phase AC systems, a conventional frequency sweep Fast Fourier Transform (FFT) method can take a long time and may not be practical in systems where the operating point cannot be maintained for a long time.

Therefore, there is a need for a system and method capable of taking advantage of short measuring times to yield increased measurement accuracy.

SUMMARY OF THE INVENTION

An illustrative aspect of the invention provides a method of impedance measurement for a three-phase alternating current (AC) system. The method comprises injecting at least one chirp signal into the three-phase AC system and collecting at least one response to the at least one chirp signal. The method further comprises transferring the at least one response from abc coordinates to dq coordinates. At least one impedance is calculated based on the at least one response to the at least one chirp signal.

Another illustrative aspect of the invention provides a system for performing impedance measurement for a three-phase alternating current (AC) system. The system comprises an injection circuit configured to inject at least one chirp signal into the three-phase AC system, and a collection circuit configured to collect at least one response to the at least one chirp signal. The system also comprises a control unit configured to transfer the at least one response from abc coordinates to dq coordinates and to calculate at least one impedance of the three-phase AC system based on the at least one response to the at least one chirp signal.

BRIEF DESCRIPTION OF THE DRAWINGS

The accompanying drawings, which are incorporated in and constitute a part of this disclosure, illustrate aspects consistent with the present disclosure and, together with the description, serve to explain advantages and principles of the present disclosure. In the drawings.

DETAILED DESCRIPTION

Figure 1:
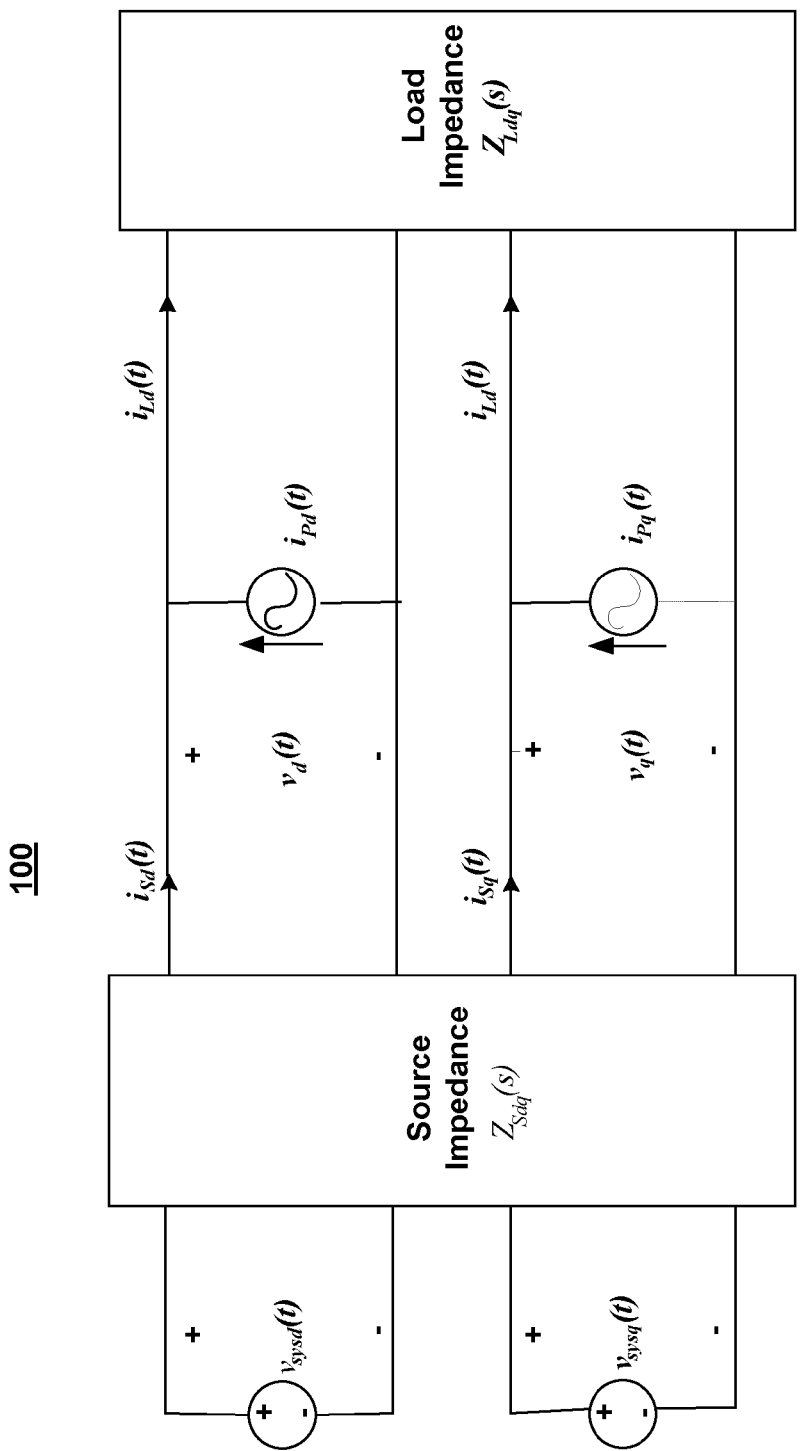
FIG. 1 schematically illustrates an example three-phase alternating current (AC) system is dq coordinates, consistent with certain disclosed embodiments.

Embodiments of the systems and methods described herein enable the extraction of data related to electric power system impedances. Stability of an electric power system can be assessed by frequency domain analysis of the "minor loop gain" transfer function, which is defined as the $Z_S/Z_L$ impedance ratio, where $Z_S$ is the source impedance and $Z_L$ is the load impedance at interfaces where the source(s) and load(s) are connected. The power system may be energized (online) and operating at various loading levels ranging from no-load to full-load. Embodiments of the present invention may use a chirp signal when injecting perturbations to perform impedance measurements at alternating current (AC) power system interfaces. In some aspects, use of a wide band linear chirp signal can significantly reduce measurement time by injecting all frequencies of interest at the same time. Because frequency drift during the impedance measurement strongly affects accuracy, this may result in the advantage of improved measurement accuracy.

The following detailed description refers to the accompanying drawings. Wherever possible, the same reference numbers will be used throughout the drawings and the following description to refer to the same or like parts. While several exemplary embodiments and features are described herein, modifications, adaptations, and other implementations are possible, without departing from the spirit and scope of the disclosure. For example, substitutions, additions or modifications may be made to the components illustrated in the drawings, and the exemplary methods described herein may be modified by substituting, reordering or adding steps to the disclosed methods. Accordingly, the following detailed description is not intended to limit the disclosure to any specific embodiments or examples.

FIG. 1 schematically illustrates an example three-phase AC system in dq coordinates, consistent with certain disclosed embodiments. As shown in FIG. 1, a three-phase balanced and symmetrical system 100 in abc coordinates can be mapped into a stationary system with a constant steady-state operating condition by applying the dq transformation. That is, by applying the dq transformation, a common three-phase AC system receiving shunt current injections can be expressed using an equivalent representation, such as the representation shown by the solid parts of FIG. 1.

Generally, a shunt is a device that allows electric current to pass around another point in the circuit by creating a low resistance path. In some embodiments, the shunt device may be achieved by placing a resistor, having a known resistance value, in series with the load. The voltage drop across the shunt is proportional to the current flowing through it, which can be calculated because the resistance value is known.

Further, as reflected in FIG. 1, the AC voltages and currents in abc coordinates may be transformed into direct current (DC) components in dq coordinates. In some embodiments, the AC voltages and currents collected or sensed at the interface may be transformed into constant values in the synchronous coordinates at the steady-state. The small signal impedance can be obtained by linearizing the system around the operating point. In FIG. 1, the dotted lines represent a disturbance to the system. The disturbance may be, for example, a perturbation.

As shown in Equation (1), the small-signal interface voltages and currents are related by the impedances.

$$\begin{bmatrix} \tilde{v}_d(s) \\ \tilde{v}_q(s) \end{bmatrix} = Z_{Sdq}(s) \begin{bmatrix} \tilde{i}_{Sd}(s) \\ \tilde{i}_{Sq}(s) \end{bmatrix}$$

$$\begin{bmatrix} \tilde{v}_d(s) \\ \tilde{v}_q(s) \end{bmatrix} = Z_{Ldq}(s) \begin{bmatrix} \tilde{i}_{Ld}(s) \\ \tilde{i}_{Lq}(s) \end{bmatrix}$$

Equation (1)

where $Z_{Sdq}(s)$ is a source impedance matrix;
$Z_{Ldq}(s)$ is a load impedance matrix;
$\tilde{v}_d(s)$ is a d-axis voltage perturbation;
$\tilde{v}_q(s)$ is a q-axis voltage perturbation;
$\tilde{i}_{Sd}(s)$ is a d-axis source current perturbation;
$\tilde{i}_{Sq}(s)$ is a q-axis source current perturbation;
$\tilde{i}_{Ld}(s)$ is a d-axis source current perturbation;
$\tilde{i}_{Lq}(s)$ is a q-axis source current perturbation; and
s is the Laplace parameter.

Figure 2:
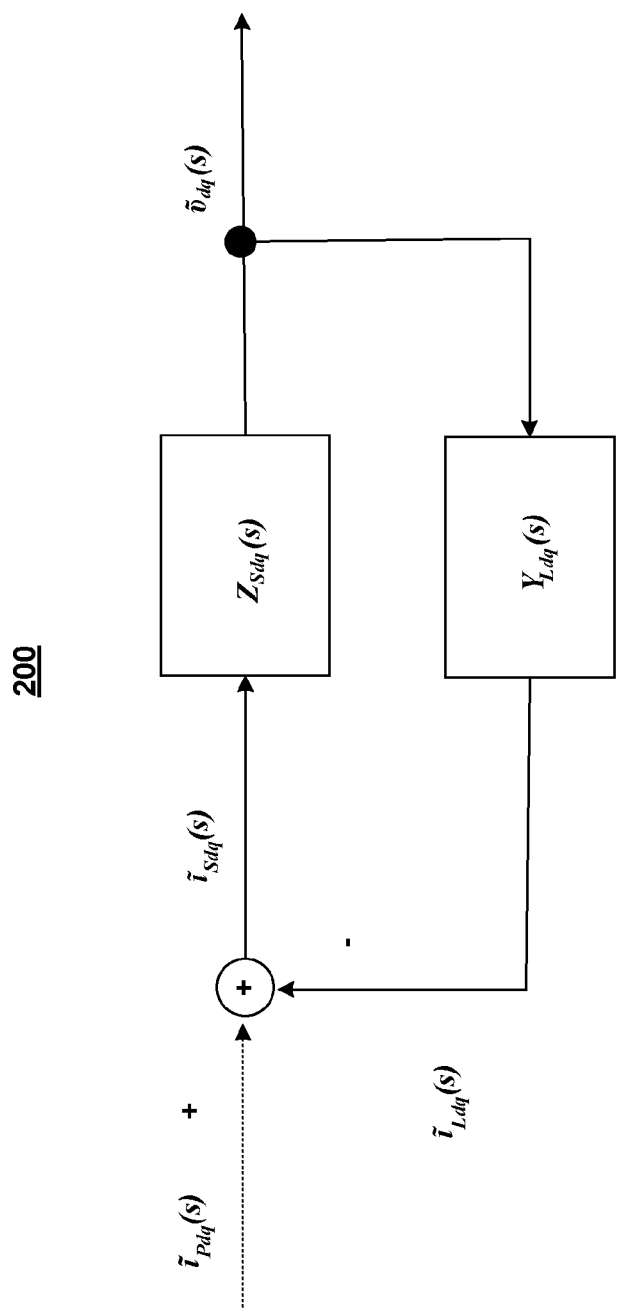
FIG. 2 schematically illustrates an example representation of a system response to disturbance, consistent with certain disclosed embodiments.

FIG. 2 schematically illustrates an example representation 200 of a system response to a disturbance, consistent with certain disclosed embodiments. That is, when a disturbance is introduced to a system, such as the currents illustrated by the dashed lines in FIG. 1, the response can be expressed as shown in the example block diagram of FIG. 2. In some embodiments, the disturbance introduced to the system may be a perturbation, and may be introduced for the purpose of measuring a system response. In the example diagram of FIG. 2, the tildes denote the small signal component of the voltages (i.e., $\tilde{v}$) and currents (i.e., $\tilde{i}$) of FIG. 1.

The impedances extracted based on the system response to disturbances, such as the example disturbances reflected in FIG. 2, can be represented by 2×2 matrices, such as that of Equation (2).

$$Z_{Sdq}(s) = \begin{bmatrix} Z_{Sdd}(s) & Z_{Sdq}(s) \\ Z_{Sqd}(s) & Z_{Sqq}(s) \end{bmatrix}$$

$$Z_{Ldq}(s) = \begin{bmatrix} Z_{Ldd}(s) & Z_{Ldq}(s) \\ Z_{Lqd}(s) & Z_{Lqq}(s) \end{bmatrix}$$

Equation (2)

where $Z_{Sdq}(s)$ is a source impedance matrix;
$Z_{Sdd}(s)$ is a dd element of source impedance;
$Z_{Sdq}(s)$ is a dq element of source impedance;
$Z_{Sqd}(s)$ is a qd element of source impedance;
$Z_{Sqq}(s)$ is a qq element of source impedance;
$Z_{Ldq}(s)$ is a load impedance matrix;
$Z_{Ldd}(s)$ is a dd element of load impedance;
$Z_{Ldq}(s)$ is a dq element of load impedance;
$Z_{Lqd}(s)$ is a qd element of load impedance; and
$Z_{Lqq}(s)$ is a qq element of load impedance.

Figure 3:
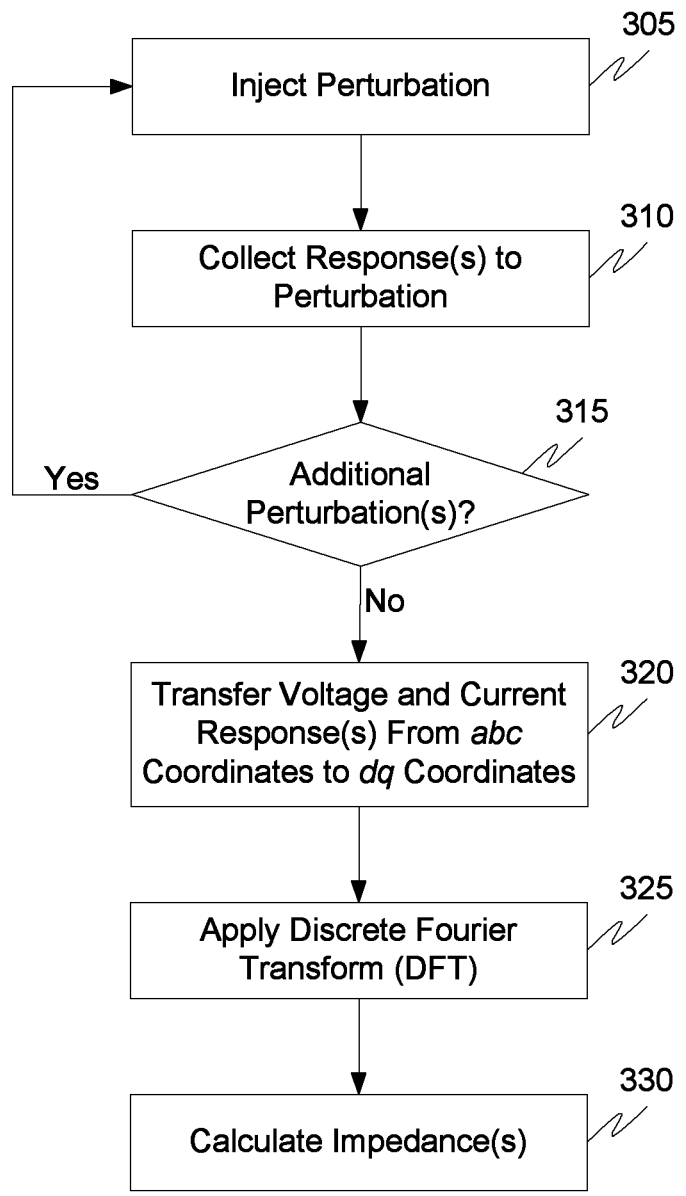
FIG. 3 is an exemplary flow chart illustrating a method of injecting one or more perturbations and determining source and load impedance values, consistent with certain disclosed embodiments.

FIG. 3 presents an exemplary flow chart illustrating a method 300 of injecting one or more disturbances into a power system, and determining source and load impedance values in response to those disturbances, consistent with certain disclosed embodiments. As used herein, a disturbance introduced into the power system may be a perturbation, such as a series injection signal.

In the method 300, a perturbation may be injected into an electrical power system at 305. The electrical power system may be an alternating current (AC) electrical power system. In embodiments, the perturbation may be a series injection signal, such as a chirp signal or a wide-band linear chirp signal. A chirp signal is a signal in which the frequency increases or decreases with time. The term chirp is often used interchangeably with sweep signal or swept-sine signal. Chirp signals may include, for example, linear chirp signals, sinusoidal linear chirp signals, and exponential chirp signals. For linear chirp signals, the instantaneous frequency, which is the derivative of the signal phase, may change linearly as a function of time. Equation (3), shown below, is a time-domain function for a sinusoidal linear chirp signal, consistent with certain disclosed embodiments.

$$x(t) = \sin\left(2\pi\left(f_0 + \frac{f_1 - f_0}{2T}t\right)t\right).$$

Equation (3)

where $f_0$ is a start frequency;
$f_1$ is an end frequency;
T is a duration of the chirp signal; and
t is a time.
In the time domain, the instantaneous frequency may be described by Equation (4) below. The instantaneous frequency may be accompanied by additional frequencies, referred to as harmonics. Generally, a harmonic frequency of a wave is a component frequency of the signal that is an integer multiple of the fundamental frequency. For example, if the fundamental frequency is f, then the harmonics have frequencies of 2f, 3f, 4f, etc. Harmonics exist as a fundamental consequence of frequency modulation. Frequency modulation is the encoding of information in a carrier wave by varying the instantaneous frequency of the wave.

$$f(t) = f_0 + \frac{f_1 - f_0}{2T}t$$

Equation (4)

Figure 4A:
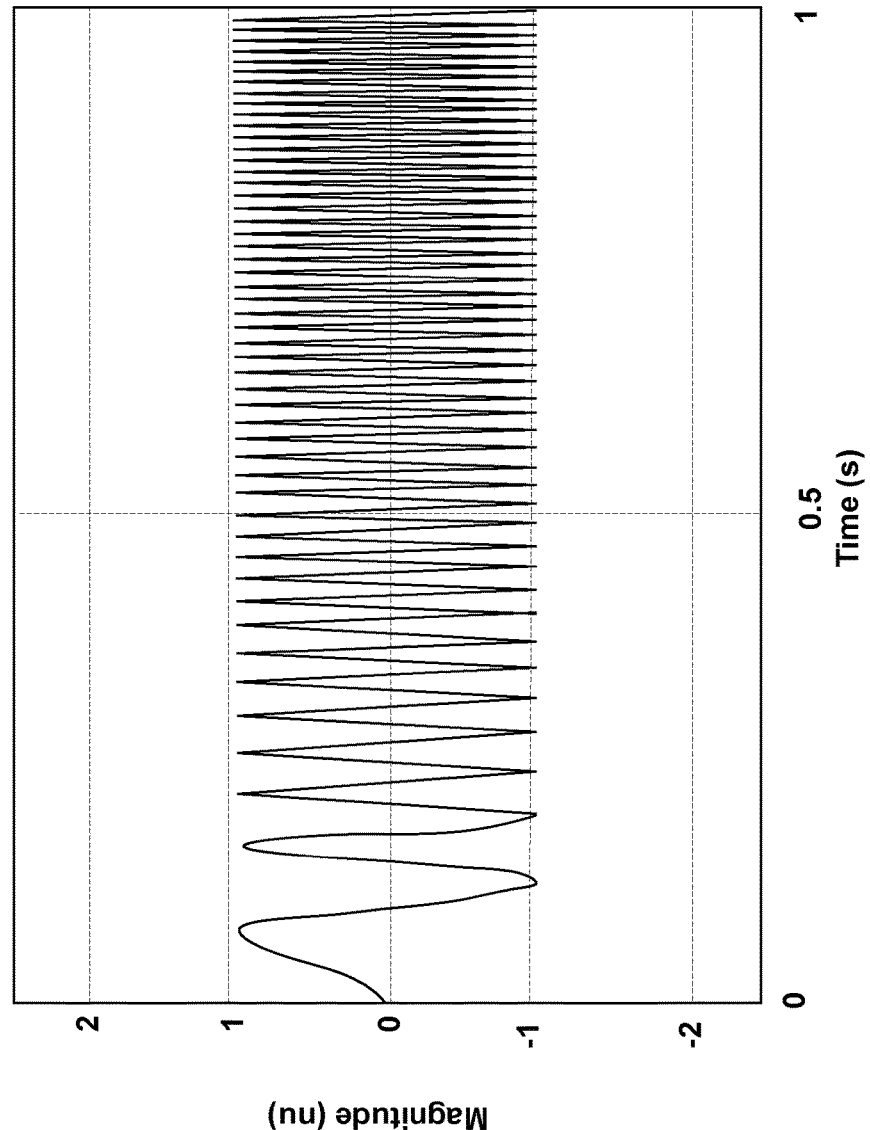
FIG. 4a is a graph illustrating an example waveform of a chirp signal, consistent with certain disclosed embodiments.
Figure 4B:
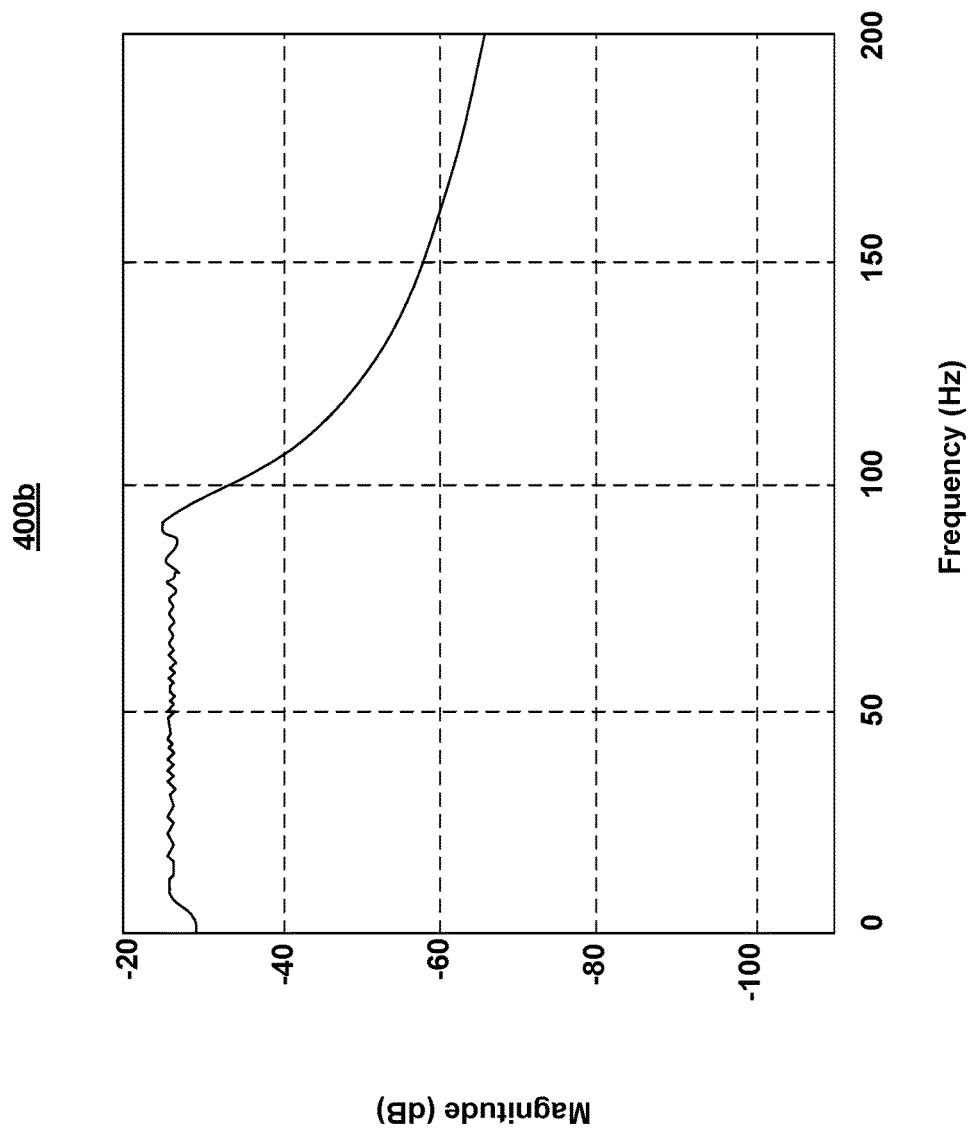
FIG. 4b is a graph illustrating an example waveform of a Discrete Fourier Transform (DFT) spectrum of the chirp signal of FIG. 4a, consistent with certain disclosed embodiments.

FIGS. 4a and 4b are graphs illustrating different aspects of an example linear chirp signal, consistent with certain disclosed embodiments. FIG. 4a is a graph 400a illustrating a waveform of the example linear chirp signal, and FIG. 4b is a graph 400b illustrating a waveform of a Discrete Fourier Transform (DFT) spectrum of the example linear chirp signal of FIG. 4a. In the examples of FIGS. 4a and 4b, the frequency of a chirp signal having a magnitude between −1 and +1 is illustrated as increasing linearly from 0 Hz to 100 Hz in one second.

As illustrated in FIGS. 4a and 4b, a linear chirp signal may have a lower crest factor. A crest factor is a measure of a waveform, such as alternating current, that shows the ratio of peak values to the average value. In other words, the crest factor provides an indication of how extreme the peaks are in a waveform. Because of the chirp signal's low crest factor, the peak, or maximum, power of the injection circuit can be designed to be smaller. As a result of the lower peak injection power, the operating point of the system to be measured may suffer from less system disturbance. Compared to a load step injection, a chirp signal may have a constant spectrum on the frequency range of interest instead of being attenuated when frequency increases. Thus, in order to obtain a clean measurement for a load step, a load step of 20% of the converter full rating and nearly 100% of the operating point may be necessary to be applied to the converter under test.

Figure 4C:
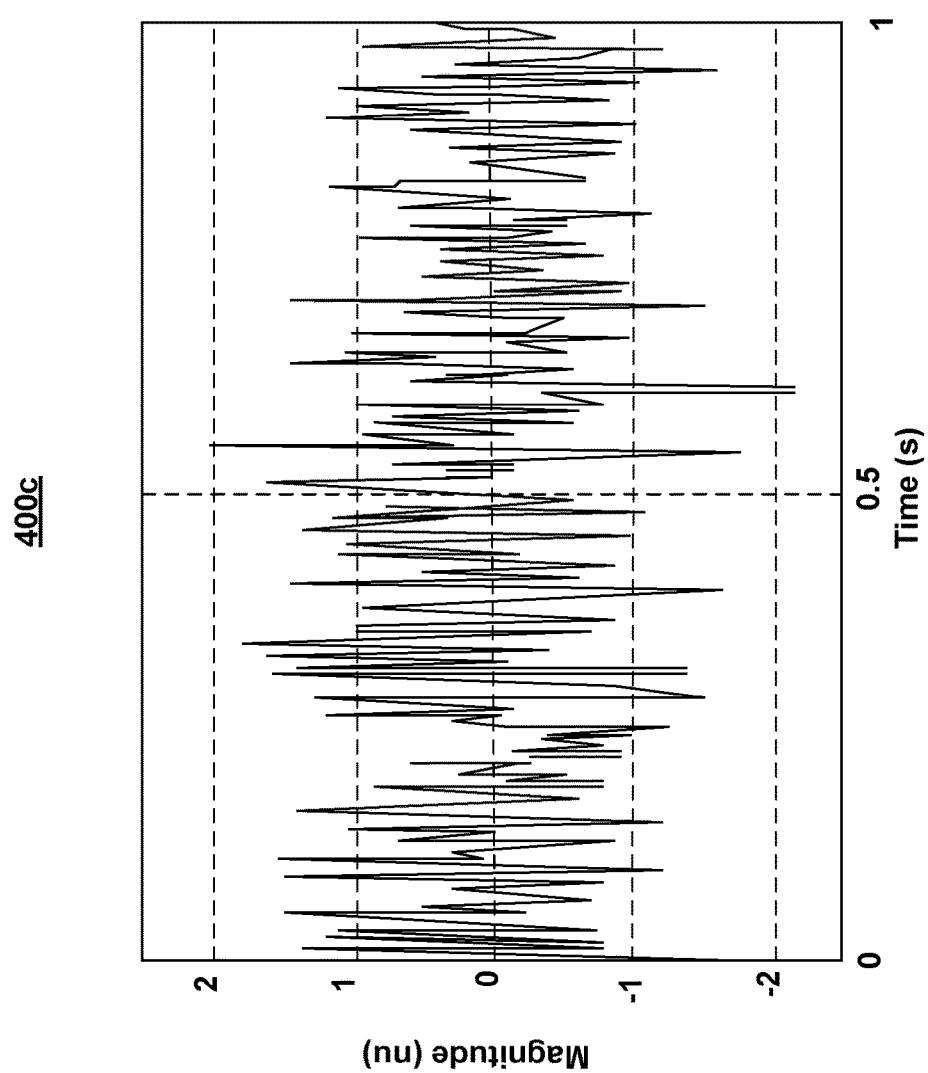
FIG. 4c is a graph illustrating an example waveform of a band-limited white noise signal, consistent with certain disclosed embodiments.
Figure 4D:
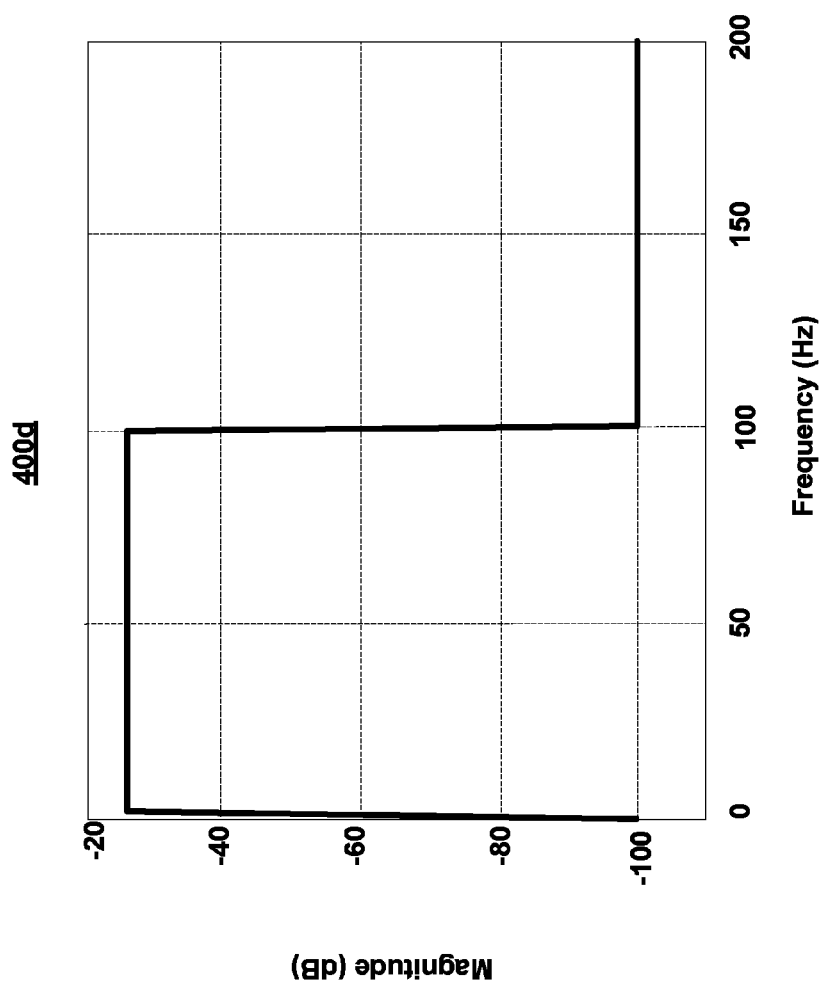
FIG. 4d is a graph illustrating an example waveform of a DFT spectrum of the band-limited white noise signal of FIG. 4c, consistent with certain disclosed embodiments.

FIGS. 4c and 4d are graphs corresponding to an example band-limited white noise signal. FIG. 4c is a graph 400c illustrating a waveform of the example band-limited white noise signal, and FIG. 4d is a graph 400d illustrating a waveform of a DFT spectrum of the example band-limited white noise signal of FIG. 4c. A white noise is a random signal with a flat or constant power spectral density. That is, a white noise is a signal that contains equal power within any frequency band with a fixed width. A band-limited white noise signal may have similar spectrum properties as a chirp signal; however, the white noise signal may require a higher peak injection power. Thus, as shown in FIGS. 4c and 4d, the peak injection power of the band-limited white noise signal may be more than twice that of the peak injection power of a sample linear chirp signal.

FIGS. 5a through 5h are graphs illustrating waveforms of example time-domain baseline signals, and corresponding graphs illustrating example waveforms of DFT spectrums of the example time-domain baseline signals. That is, FIGS. 5a through 5h compare several approaches for tuning a waveform to improve the signal to noise ratio (SNR). Typically, background noise may exist in any practical measurement setup. Because a chirp signal spreads the power over a wide frequency range, the signal's power density is increased and it may be more susceptible to the noise.

Figure 5A:
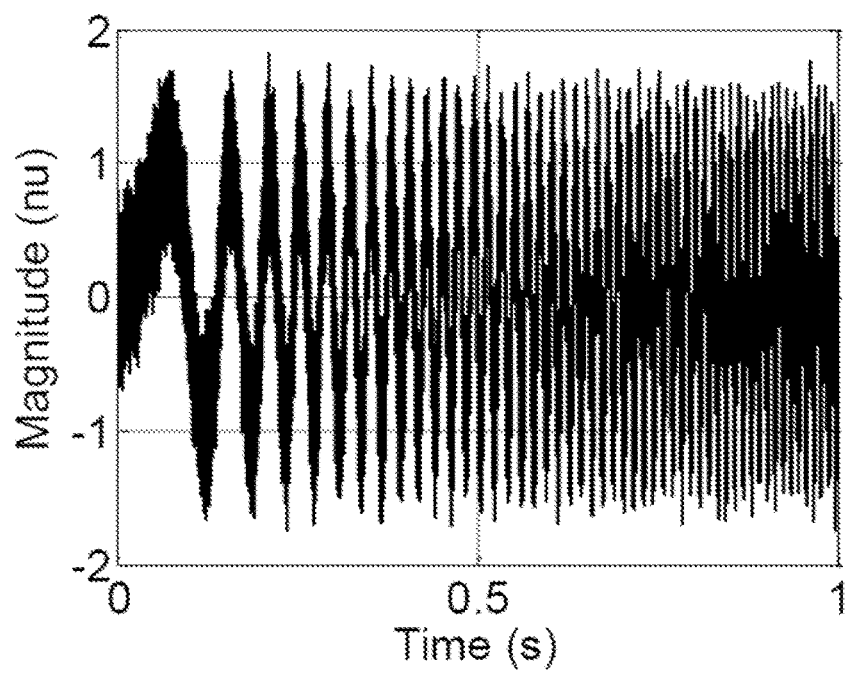
FIG. 5a is a graph illustrating an example waveform of a time-domain chirp signal, consistent with certain disclosed embodiments.
Figure 5B:
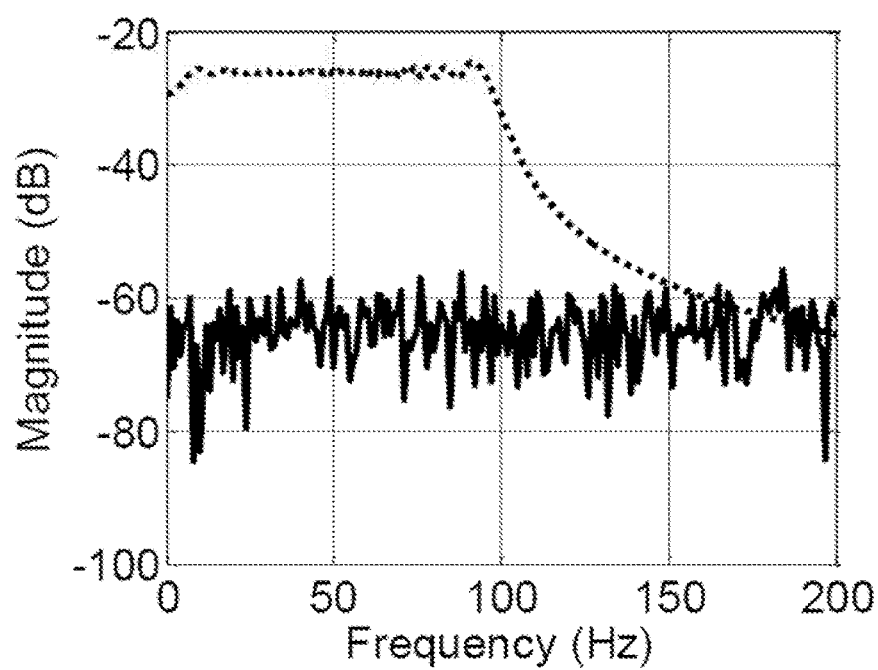
FIG. 5b is a graph illustrating an example waveform of a DFT spectrum of the time-domain chirp signal of FIG. 5a, consistent with certain disclosed embodiments.
Figure 5C:
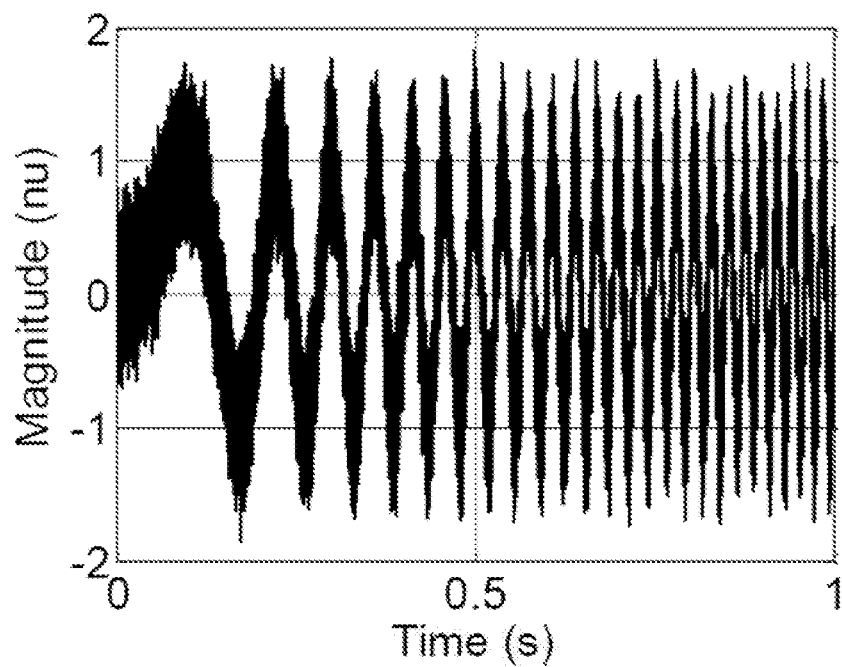
FIG. 5c is a graph illustrating an example waveform of a time-domain chirp signal, consistent with certain disclosed embodiments.
Figure 5D:
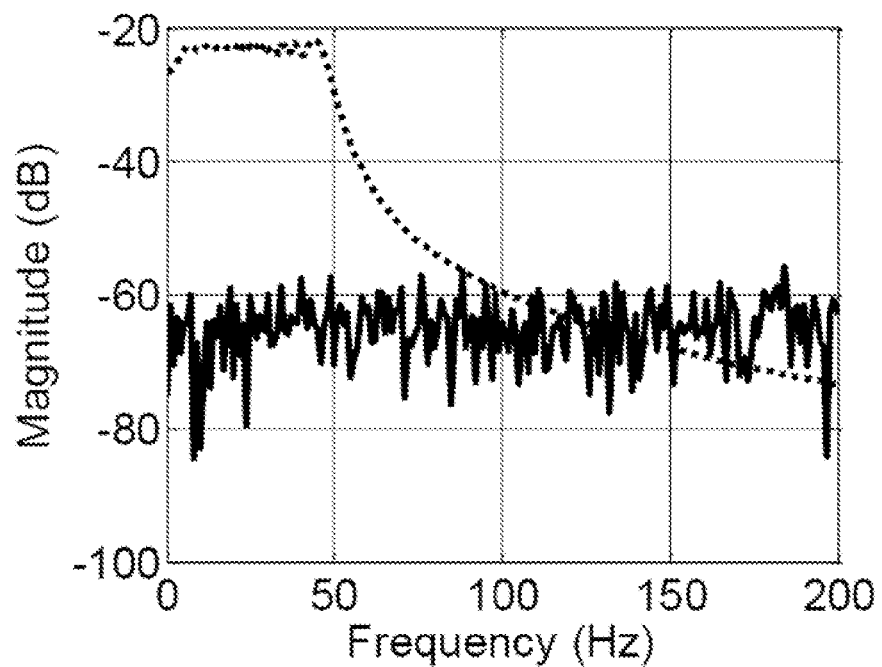
FIG. 5d is a graph illustrating an example waveform of a DFT spectrum of the time-domain chirp signal of FIG. 5c, consistent with certain disclosed embodiments.

FIGS. 5a and 5b illustrate the respective time-domain waveform and spectrum of a base line signal. The baseline signal used by FIGS. 5a and 5b is achieve by taking the sample signal of FIG. 4a and additing −6.6 dBW white noise, which may be calculated by applying the signal on one ohm resistor. The baseline signal utilized by the graphs of FIGS. 5a and 5b may be used as the baseline signal for the comparisons illustrated in FIGS. 5c-5h FIGS. 5c and 5d illustrate the effect of a first method to increase the SNR. As shown in FIGS. 5c and 5d, the first method may include reducing the frequency span, which can increase the signal power density. FIG. 5c shows a chirp signal covering only direct current (DC) to 50 Hz with a same level of the noise added. As illustrated in the spectrum graph of FIG. 5d, the corresponding signal level may be increased by approximately 3 dB.

Figure 5E:
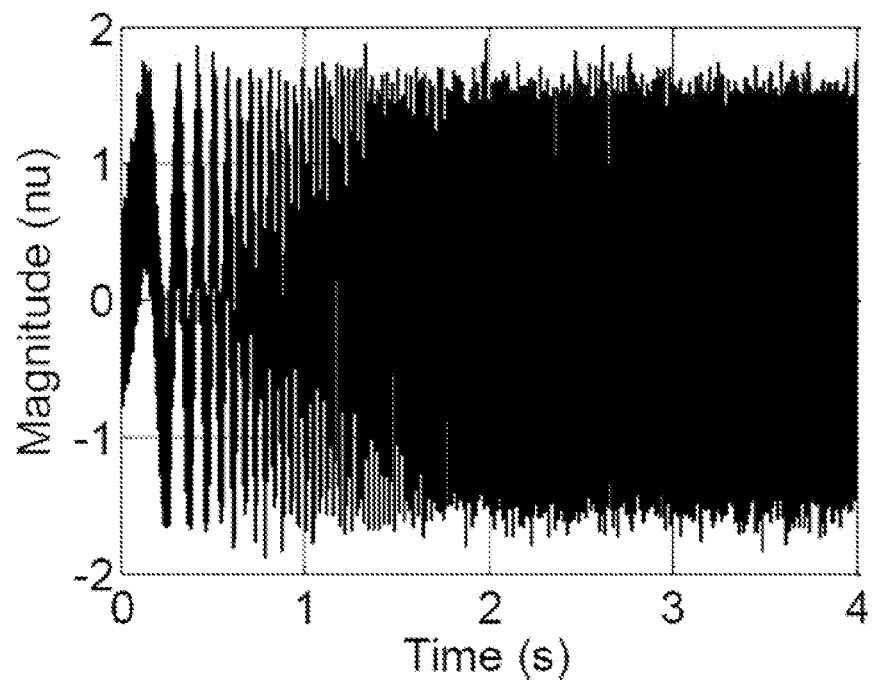
FIG. 5e is a graph illustrating an example waveform of a time-domain chirp signal, consistent with certain disclosed embodiments.
Figure 5F:
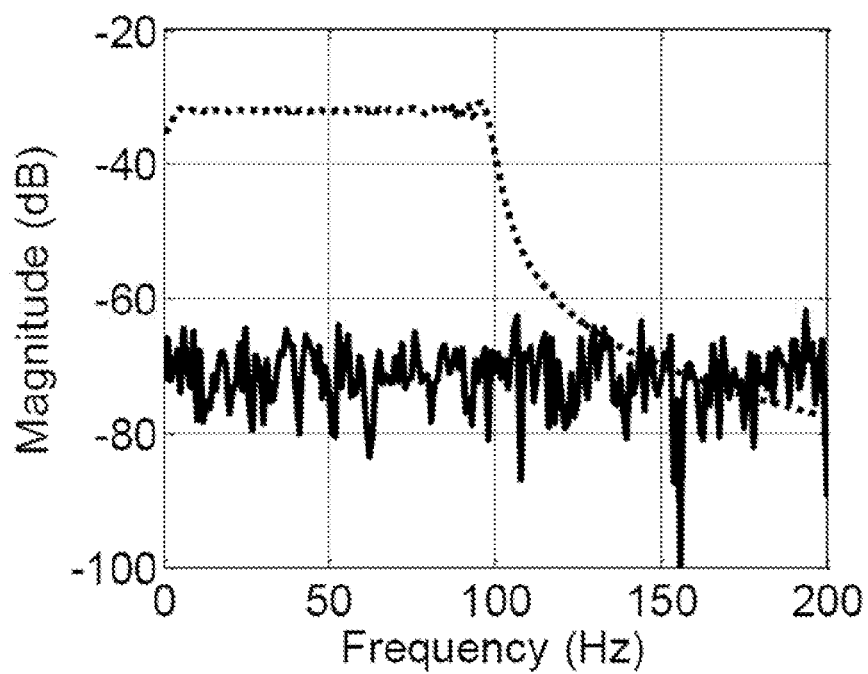
FIG. 5f is a graph illustrating an example waveform of a DFT spectrum of the time-domain chirp signal of FIG. 5e, consistent with certain disclosed embodiments.

FIGS. 5e and 5f illustrate the effect of a second method to increase the SNR, which may include measuring for a longer time and taking an average of the data. As shown in FIG. 5e, a chirp signal may be extended to last, for example, four seconds, and then cut into four equal segments. The DFT of each of the four equal segments may be determined, and the average of the four DFT results may be calculated, as illustrated in the spectrum graph of FIG. 5f. Although the noise level is lowered, the signal level may be decreased by the same level and, in some aspects, no improvement of SNR may be gained because the four parts cut from a chirp signal are not correlated to each other. Thus, to create the correlation, the chirp signal may be repeated instead of extended.

Figure 5G:
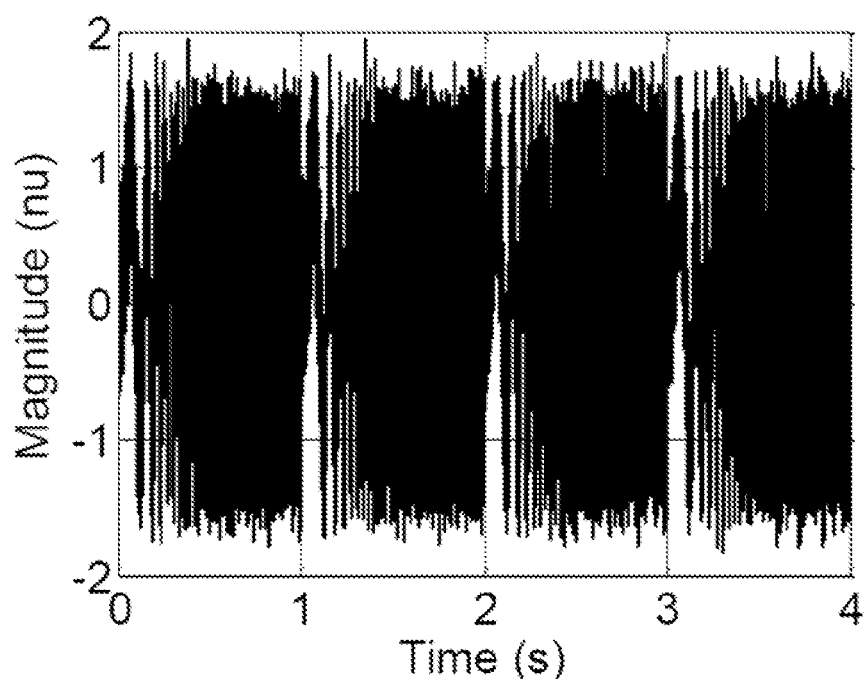
FIG. 5g is a graph illustrating an example waveform of a time-domain chirp signal, consistent with certain disclosed embodiments.
Figure 5H:
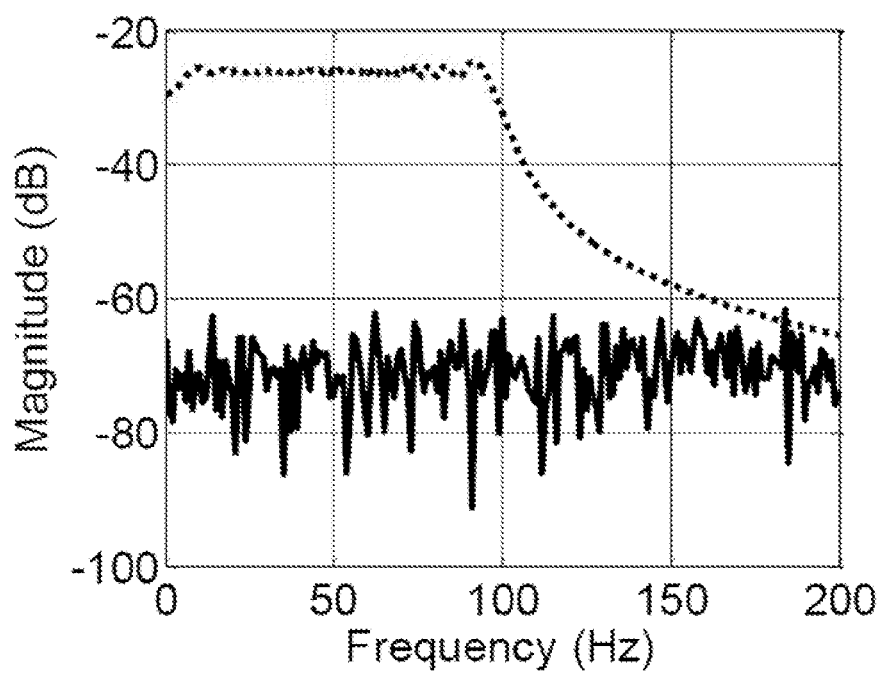
FIG. 5h is a graph illustrating an example waveform of a DFT spectrum of the time-domain chirp signal of FIG. 5g, consistent with certain disclosed embodiments.

FIGS. 5g and 5h illustrate the effect of a third method to increase the SNR, which may include repeating the sample signal four times. In FIG. 5g, the sample signal is repeated four times. The DFT of each of the four sample signals may be calculated, and the average of the four DFT results may be calculated, as illustrated in the spectrum graph of FIG. 5h. In this aspect, as shown in FIG. 5h, the noise level may be lowered by about 6 dB while maintaining a signal level having the same magnitude as that of FIG. 5a. Both approaches, i.e., limiting bandwidth and frequency domain averaging, may be used in the embodiments disclosed herein.

Due to the possible asynchronous sampling of the signal, an averaging method may be used for data processing instead of a direct average of the spectra. In other words, a frequency domain average method may enhance the SNR and thereby improve measurement accuracy. This aspect may involve windowing and overlapping when cutting and calculating the spectra, which may alleviate the leakage effect caused by asynchronous sampling.

Returning to the method 300 of FIG. 3, circuit responses at the AC interfaces may be collected at 310. Circuit responses may include $Z_S$, the source impedance, and $Z_L$, the load impedance. In some embodiments, $Z_S$ and $Z_L$ may be measured at interfaces where the source(s) and load(s) are connected.

A determination as to whether additional perturbations are to be injected may be made at 315. In some embodiments, only a single perturbation may be used, while in other embodiments, two perturbations may be used. If the system is held in a steady-state, more than two perturbations may be used to improve measurement accuracy. In some embodiments, a system for carrying out the method 300 may be configured to determine whether additional perturbations are to be performed. This determination may be based on system measurements or by accessing a memory location and retrieving a parameter that defines a number of desired perturbations. The parameter may be set, for example, via a user interface associated with the system. The memory location may include any suitable type of memory, such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium. The system may make the determination using a computer processor executing computer program instructions, and the computer program instructions may also be stored in a memory associated with the system and/or computer processor.

If the system determines that additional perturbations are desired (315, Yes), one or more additional perturbations may be injected into the system (305) and the responses collected (310), as discussed above. When no additional perturbations are to be injected (315, No), the collected voltage and current responses may be transferred from the abc coordinate domain to the dq coordinate domain using a phase obtained by a Phase-Locked Loop (PLL) operating in real-time during the response acquisition (320). After the coordinate transformation from the abc coordinate domain to the dq coordinate domain, a Discrete Fourier Transform (DFT) may be used to obtain the spectra of the voltages and currents (325).

In one example of the systems and methods for extracting system impedances from a physical system, small disturbances may be injected into the system. The small disturbances may be signal injections, such as, for example, shunt injection signals, chirp injection signals, series injection signals, etc. The circuit responses at the AC interface may be collected through, for example, one or more sensors and then used to calculate the impedances. As shown above in Equations (1) and (2), two independent perturbations may be used to derive four scalar impedances of the matrix. In certain embodiments, it may be assumed that the system is held at the same state during the two perturbations, which implies that impedance matrices do not change during the measurement.

Referring to the shunt current injection illustrated in FIG. 1, a first perturbation may be created by injecting only current $i_{Pd}$ while setting $i_{Pq}$ to zero. In this example, $i_{Pd}$ is the d-axis perturbation or injection signal and $i_{Pq}$ is the q-axis perturbation or injection signal. The response to the first perturbation—or the d-axis injection—can be measured to obtain Equation (5).

$$\begin{bmatrix} \tilde{v}_{d1}(s) \\ \tilde{v}_{q1}(s) \end{bmatrix} = Z_{Sdq}(s) \begin{bmatrix} \tilde{i}_{Sd1}(s) \\ \tilde{i}_{Sq1}(s) \end{bmatrix} \quad \text{Equation (5)}$$

$$\begin{bmatrix} \tilde{v}_{d1}(s) \\ \tilde{v}_{q1}(s) \end{bmatrix} = Z_{Ldq}(s) \begin{bmatrix} \tilde{i}_{Ld1}(s) \\ \tilde{i}_{Lq1}(s) \end{bmatrix}$$

where $Z_{Sdq}(s)$ is a source impedance matrix;
$Z_{Ldq}(s)$ is a load impedance matrix;
$\tilde{v}_{d1}(s)$ is a first perturbation in d-axis voltage;
$\tilde{v}_{q1}(s)$ is a first perturbation in q-axis voltage;
$\tilde{i}_{Sd1}(s)$ is a first perturbation in d-axis source current;
$\tilde{i}_{Sq1}(s)$ is a first perturbation in q-axis source current;
$\tilde{i}_{Ld1}(s)$ is a first perturbation in d-axis load current; and
$\tilde{i}_{Lq1}(s)$ is a first perturbation in q-axis load current.

A second perturbation may be achieved by injecting only current $i_{Pq}$ while setting $i_{Pd}$ to zero. The response to the second perturbation—or the q-axis injection—can be measured to obtain Equation (6).

$$\begin{bmatrix} \tilde{v}_{d2}(s) \\ \tilde{v}_{q2}(s) \end{bmatrix} = Z_{Sdq}(s) \begin{bmatrix} \tilde{i}_{Sd2}(s) \\ \tilde{i}_{Sq2}(s) \end{bmatrix}$$

$$\begin{bmatrix} \tilde{v}_{d2}(s) \\ \tilde{v}_{q2}(s) \end{bmatrix} = Z_{Ldq}(s) \begin{bmatrix} \tilde{i}_{Ld2}(s) \\ \tilde{i}_{Lq2}(s) \end{bmatrix} \quad \text{Equation (6)}$$

where $Z_{Sdq}(s)$ is a source impedance matrix;
$Z_{Ldq}(s)$ is a load impedance matrix;
$\tilde{v}_{d2}(s)$ is a second perturbation in d-axis voltage;
$\tilde{v}_{q2}(s)$ is a second perturbation in q-axis voltage;
$\tilde{i}_{Sd2}(s)$ is a second perturbation in d-axis source current;
$\tilde{i}_{Sq2}(s)$ is a second perturbation in q-axis source current;
$\tilde{i}_{Ld2}(s)$ is a second perturbation in d-axis load current; and
$\tilde{i}_{Lq2}(s)$ is a second perturbation in q-axis load current.

As shown below, Equation (7) may be obtained by combining Equation (5) and Equation (6) to generate a transfer function. That is, combining Equations (5) and (6) from the separate perturbation signals on the d channel and q channel may form a two-by-two matrix, which cannot be obtained by a single physical perturbation.

$$\begin{bmatrix} \tilde{v}_{d1}(s) & \tilde{v}_{d2}(s) \\ \tilde{v}_{q1}(s) & \tilde{v}_{q2}(s) \end{bmatrix} = Z_{Sdq}(s) \begin{bmatrix} \tilde{i}_{Sd1}(s) & \tilde{i}_{Sd2}(s) \\ \tilde{i}_{Sq1}(s) & \tilde{i}_{Sq2}(s) \end{bmatrix}$$

$$\begin{bmatrix} \tilde{v}_{d1}(s) & \tilde{v}_{d2}(s) \\ \tilde{v}_{q1}(s) & \tilde{v}_{q2}(s) \end{bmatrix} = Z_{Ldq}(s) \begin{bmatrix} \tilde{i}_{Ld1}(s) & \tilde{i}_{Ld2}(s) \\ \tilde{i}_{Lq1}(s) & \tilde{i}_{Lq2}(s) \end{bmatrix} \quad \text{Equation (7)}$$

From Equation (7), the impedance matrices can be solved as shown in Equation (8) below.

$$Z_{Sdq}(s) = \begin{bmatrix} \tilde{v}_{d1}(s) & \tilde{v}_{d2}(s) \\ \tilde{v}_{q1}(s) & \tilde{v}_{q2}(s) \end{bmatrix} \begin{bmatrix} \tilde{i}_{Sd1}(s) & \tilde{i}_{Sd2}(s) \\ \tilde{i}_{Sq1}(s) & \tilde{i}_{Sq2}(s) \end{bmatrix}^{-1}$$

$$Z_{Ldq}(s) = \begin{bmatrix} \tilde{v}_{d1}(s) & \tilde{v}_{d2}(s) \\ \tilde{v}_{q1}(s) & \tilde{v}_{q2}(s) \end{bmatrix} \begin{bmatrix} \tilde{i}_{Ld1}(s) & \tilde{i}_{Ld2}(s) \\ \tilde{i}_{Lq1}(s) & \tilde{i}_{Lq2}(s) \end{bmatrix}^{-1} \quad \text{Equation (8)}$$

In addition, one or more additional frequency points of interest may be identified and the impedance calculations of Equation (8) may be repeated at each of the identified frequency points of interest. In such embodiments, the voltage and current vectors may be acquired by frequency sweep or by applying an FFT on wide bandwidth signal responses. Generally, the term "frequency sweep" refers to the scanning of a frequency band to detect transmitted signals. A Fourier transform is used to convert time or space to frequency and vice versa. An FFT is an algorithm that may be used to compute the DFT and its inverse.

In some embodiments, a linear chirp injection signal may cause the perturbation power to be spread over a wide frequency range, causing it to be more susceptible to background noise in the system. As a result, the impedance results may be noisier than the ones obtained by a sinusoidal excitation. Influence from uncorrelated noise may be reduced by taking into account the perturbation signal using, for example, a cross-correlation method. In such embodiments, instead of the spectra of the response signals, the transfer functions from the perturbation signal to the response signals may be used in the impedance calculation. Equation (9) describes a generic linear time-invariant discrete-time system in which v(k) defines the noise signal.

$$y(n) = \sum_{k=1}^{\infty} h(k)u(n-k) + v(n) \quad \text{Equation (9)}$$

where y(n) is the output signal;
k is $k^{th}$ sample index;
h(k) is a system impulse response;
u is an input signal;
n is an $n^{th}$ sample index; and
v(n) is an uncorrelated noise signal.

In certain embodiments, the method may calculate the cross-correlation between input and output signals. Equation (10) illustrates an example result.

$$R_{uy}(m) = \sum_{k=1}^{\infty} u(n)y(n+m)$$
$$= \sum_{k=1}^{\infty} h(n)R_{uu}(m-n) + R_{uv}(m) \quad \text{Equation (10)}$$

where $R_{uy}(m)$ is a cross-correlation between input u and output y;
m is an $m^{th}$ sample index;
u is an input signal;
u(n) is an $n^{th}$ input sample;
y is an output signal;
y(n+m) is an $(n+m)^{th}$ output sample;
h(n) is an impulse response;
$R_{uu}(m-n)$ is an auto-correlation of the input signal at the $(m-n)^{th}$ sample;
$R_{uv}(m)$ is a cross-correlation between input signal and noise, which is zero;
k is an index for the $k^{th}$ sample; and
n is an index for the $n^{th}$ sample.

In some frameworks, the input signal may be selected such that $R_{uu}(m)=\delta(m)$, where $\delta(m)$ is an impulse function. In such frameworks, the transfer function $H(j\omega)$ of a uy cross-correlation to a uu auto-correlation may be calculated by applying a DFT to $R_{uy}(m)$.

For a linear chirp injection signal, however, the Ruu(m) is not equal to $\delta(m)$. Thus the transfer function may be calculated by Equation (11) below. In Equation (11), DFT(x) may refers to the application of DFT on signal x.

$$H(j\omega) = \frac{DFT(R_{uy}(m))}{DFT(R_{uu}(m))} \quad \text{Equation (11)}$$

where $H(j\omega)$ is a transfer function of a uy cross-correlation to a
uu is an auto-correlation;
j is a square root of −1;
$\omega$ is a frequency in rad/sec;
$R_{uy}$ is a cross-correlation for input u and output y;
$R_{uy}(m)$ is an $m^{th}$ sample in the auto-correlation of u and y;

$R_{uu}$ is an auto-correlation for input signal u;

$R_{uu}(m)$ is an $m^{th}$ sample in the autocorrelation for signal u; and m is an $m^{th}$ sample index.

Figure 6:
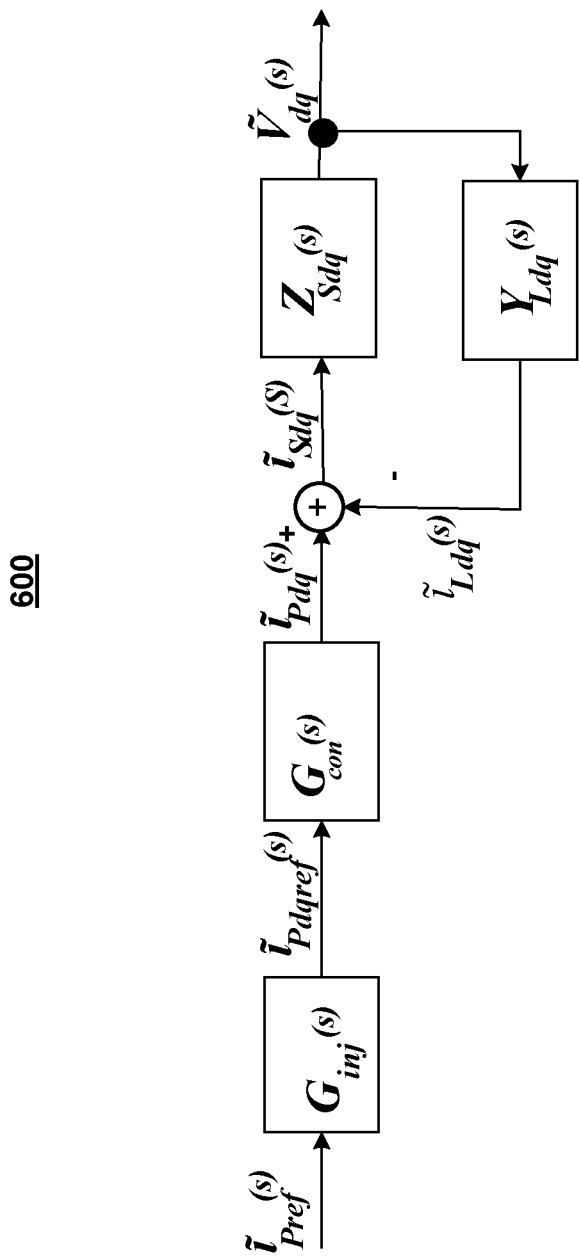
FIG. 6 is a block diagram that illustrates an example representation of a system response to disturbance, consistent with certain disclosed embodiments.

FIG. 6 is a block diagram that illustrates an example representation 600 of a system response to disturbance. The example system block diagram of FIG. 6 may be used to create single-input-single-output (SISO) transfer functions that can be solved from the data of one perturbation on the three-phase AC power system. As illustrated in FIG. 6, $G_{con}(s)$ may be the transfer function of an infection circuit. In the embodiment illustrated in FIG. 6, the perturbations on the d channel and the q channel are no longer considered independent of one another, but may be generated from a single virtual perturbation signal through the transfer function matrix $G_{inj}(s)$. As used herein, a transfer function matrix may be used to calculate virtual perturbations in the dq coordinate system based on a single physical perturbation in the abc coordinate system. Equation (12) shows an equation for generating a single virtual perturbation signal through the transfer function matrix $G_{inj}(s)$.

$$G_{inj}(s) = \begin{bmatrix} G_{injd}(s) \\ G_{injq}(s) \end{bmatrix} \qquad \text{Equation (12)}$$

where $G_{inj}(s)$ is an injection transfer function matrix;

$G_{injd}(s)$ is a d-axis injection transfer function; and $G_{injq}(s)$ is a q-axis injection transfer function.

To generate two independent perturbations in the dq coordinate system based on a single physical perturbation in the abc coordinate system, $i_p(s)$ may be kept the same for the two perturbations and two transfer function matrices $G_{inj}(s)$ may be used. Here, $\tilde{i}_p(s)$ is a perturbation in the source current. In certain embodiments, the two transfer function matrices $G_{inj}(s)$ may be different, as shown in Equation (13).

$$G_{inj1}(s)=[A_1\ B_1]^T,\ G_{inj2}(s)=[A_2\ B_2]^T \qquad \text{Equation (13)}$$

where $G_{inj1}(s)$ is a first injection transfer function matrix;

$G_{inj2}(s)$ is a second injection transfer function matrix;

$G_{inj1}$ is a first transfer function;

$G_{inj2}$ is a second transfer function;

$A_1$ is a first element in the transfer function $G_{inj1}$;

$A_2$ is a first element in the transfer function $G_{inj2}$;

$B_1$ is a second element in the transfer function $G_{inj1}$;

$B_2$ is a second element in the transfer function $G_{inj2}$; and

T is the transpose symbol.

In Equation (13), matrices $[A_1\ B_1]^T$ and $[A_2\ B_2]^T$ may be two independent and constant vectors. In this way, when a chirp signal is applied as a virtual perturbation in the abc coordinate system, the perturbations on both the d channel and the q channel in the dq coordinate system may also be chirp signals. That is, the system may become a Single Input Multiple Output (SIMO) system, whereby with only one excitation at the input port, all the desired transfer functions may be found.

Referring again to FIG. 6, the transfer functions from the input to the voltages and the transfer functions from the input to the currents may be linked by the system impedances, as shown below in Equation (14).

$$\begin{bmatrix} \frac{\tilde{v}_d(s)}{\tilde{i}_p(s)} \\ \frac{\tilde{v}_q(s)}{\tilde{i}_p(s)} \end{bmatrix} = Z_{Sdq}(s) \begin{bmatrix} \frac{\tilde{i}_{Sd}(s)}{\tilde{i}_p(s)} \\ \frac{\tilde{i}_{Sq}(s)}{\tilde{i}_p(s)} \end{bmatrix} \qquad \text{Equation (14)}$$

$$\begin{bmatrix} \frac{\tilde{v}_d(s)}{\tilde{i}_p(s)} \\ \frac{\tilde{v}_q(s)}{\tilde{i}_p(s)} \end{bmatrix} = Z_{Ldq}(s) \begin{bmatrix} \frac{\tilde{i}_{Ld}(s)}{\tilde{i}_p(s)} \\ \frac{\tilde{i}_{Lq}(s)}{\tilde{i}_p(s)} \end{bmatrix}$$

In some embodiments, transfer function vectors from two perturbations in the dq coordinate system may be used to calculate the impedance matrices, as shown below in Equation (15).

$$Z_{Sdq}(s) = \begin{bmatrix} \frac{\tilde{v}_{d1}(s)}{\tilde{i}_p(s)} & \frac{\tilde{v}_{d2}(s)}{\tilde{i}_p(s)} \\ \frac{\tilde{v}_{q1}(s)}{\tilde{i}_p(s)} & \frac{\tilde{v}_{q2}(s)}{\tilde{i}_p(s)} \end{bmatrix} \begin{bmatrix} \frac{\tilde{v}_{Sd1}(s)}{\tilde{i}_p(s)} & \frac{\tilde{v}_{Sd2}(s)}{\tilde{i}_p(s)} \\ \frac{\tilde{v}_{Sq1}(s)}{\tilde{i}_p(s)} & \frac{\tilde{v}_{Sq2}(s)}{\tilde{i}_p(s)} \end{bmatrix}^{-1} \qquad \text{Equation (15)}$$

$$Z_{Ldq}(s) = \begin{bmatrix} \frac{\tilde{v}_{d1}(s)}{\tilde{i}_p(s)} & \frac{\tilde{v}_{d2}(s)}{\tilde{i}_p(s)} \\ \frac{\tilde{v}_{q1}(s)}{\tilde{i}_p(s)} & \frac{\tilde{v}_{q2}(s)}{\tilde{i}_p(s)} \end{bmatrix} \begin{bmatrix} \frac{\tilde{v}_{Ld1}(s)}{\tilde{i}_p(s)} & \frac{\tilde{v}_{Ld2}(s)}{\tilde{i}_p(s)} \\ \frac{\tilde{v}_{Lq1}(s)}{\tilde{i}_p(s)} & \frac{\tilde{v}_{Lq2}(s)}{\tilde{i}_p(s)} \end{bmatrix}^{-1}$$

Figure 7:
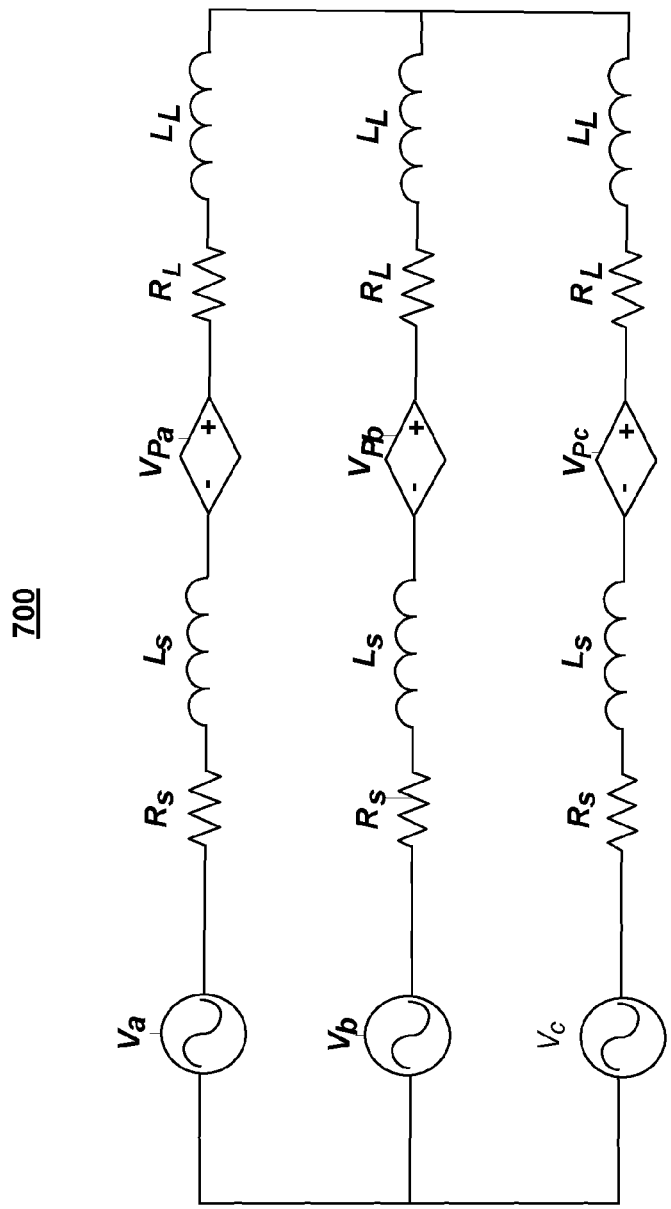
FIG. 7 schematically illustrates an example representation of a simulation circuit, consistent with certain disclosed embodiments.

FIG. 7 schematically illustrates an example representation of a simulation circuit 700, consistent with certain disclosed embodiments. As shown in FIG. 7, a three-phase fixed-frequency voltage source may feed a three-phase R-L load through small resistors and inductors representing the bus impedances. In the embodiment of FIG. 7, the voltage source may operate at 60 Hz. In this embodiment, the perturbation may be generated using ideal controlled voltage sources instead of the current sources illustrated in FIG. 1. The voltage sources may allow for improved high-impedance load-side measurement, which is the measurement target in this simulation. In certain embodiments, the circuit parameters may be set to the values disclosed below in Table 1.

TABLE I

Simulation Circuit Parameters

| Parameter | Value |
| --- | --- |
| Source Voltages (rms per phase) | 266 V |
| Source Resistance | 0.01 Ω |
| Source Inductance | 10 μH |
| Load Resistance | 7 Ω |
| Load Inductance | 460 μH |
| Peak Injection Voltage (per phase) | 4 V |
| Measurement Frequency Range | 1 Hz-1 kHz |

FIGS. 8a-8d graphically illustrate example extracted impedances corresponding to a chirp injection signal, consistent with certain disclosed embodiments. In FIGS. 8a-8d, white noises with −20 dB/Hz power spectra density may be added to the three-phase source, producing a voltage signal SNR of approximately 0 dB. The examples of FIGS. 8a-8d represent the extracted impedances of the $Z_{dd}$ terms for four different impedance extraction procedures.

Figure 8A:
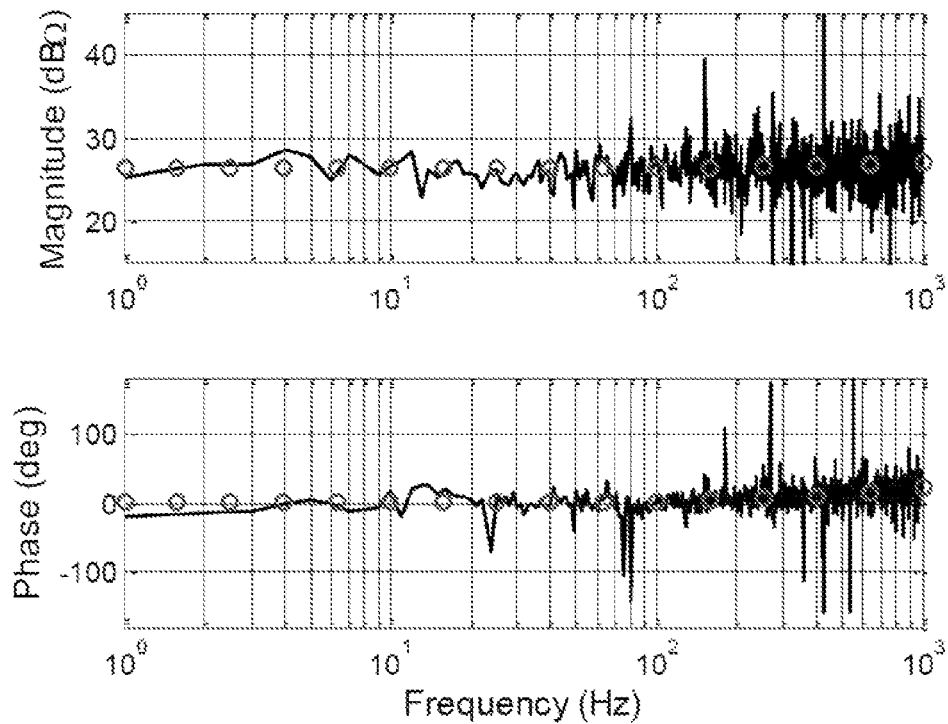
FIG. 8a graphically illustrates an example extracted impedance of a chirp injection signal, consistent with certain disclosed embodiments.
Figure 8B:
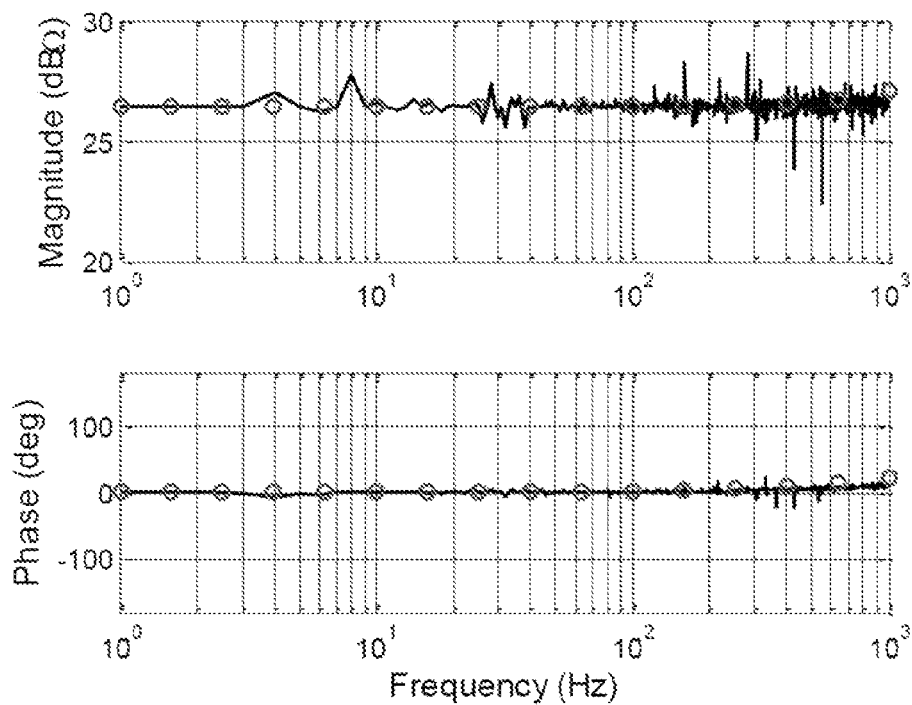
FIG. 8b graphically illustrates an example extracted impedance of a chirp injection signal, consistent with certain disclosed embodiments.
Figure 8C:
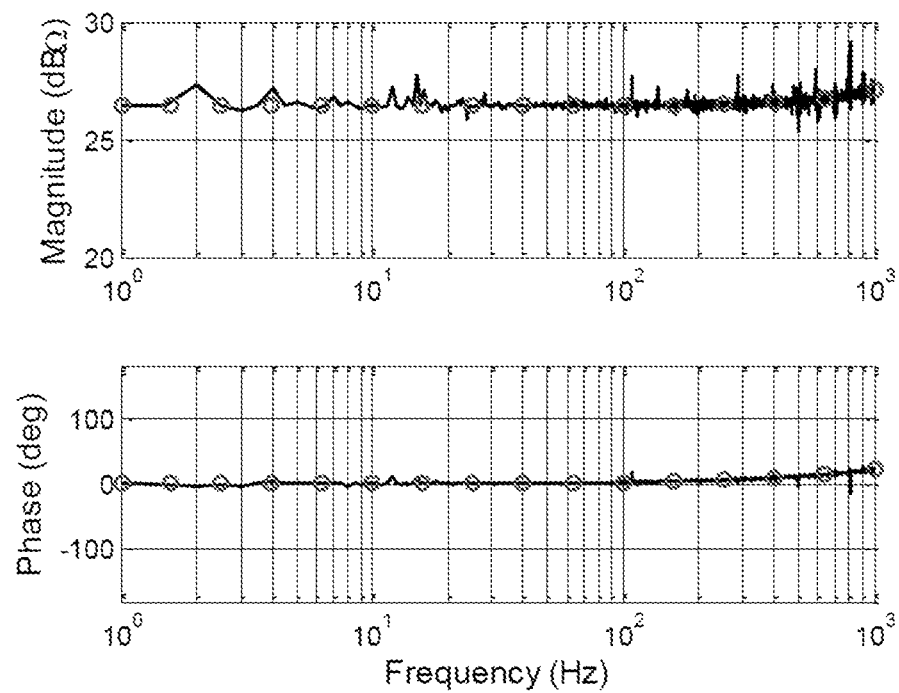
FIG. 8c graphically illustrates an example extracted impedance of a chirp injection signal, consistent with certain disclosed embodiments.
Figure 8D:
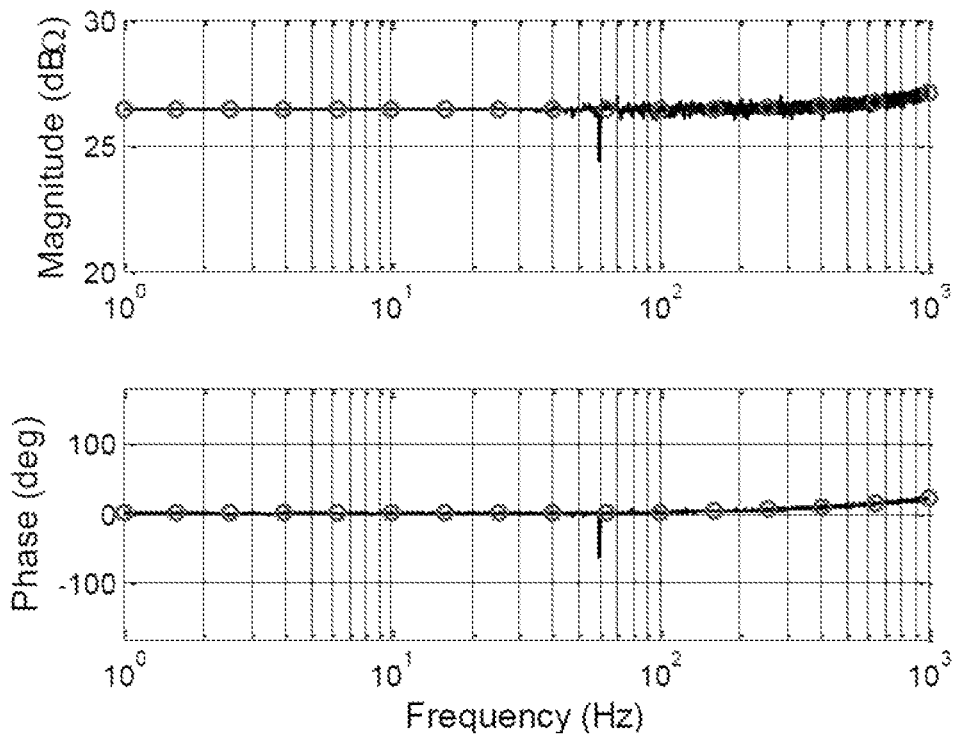
FIG. 8d graphically illustrates an example extracted impedance of a chirp injection signal, consistent with certain disclosed embodiments.

In FIG. 8a, a single chirp is injected for the entire frequency range, and a DFT-based spectrum calculation is used to determine the extracted impedance. In FIG. 8b, a single chirp is injected for the entire frequency range, and a correlation method is used to determine the extracted impedance. In FIG. 8c, the frequency range is split into ten equal segments and a single chirp is injection for each segment. In FIG. 8c, a correlation method is used to determine the extracted impedance. In FIG. 8d, the frequency range is split into ten equal segments and ten chirp signals are injection for each segment. In FIG. 8d, a correlation method and average technique are used to determine the extracted impedance. As reflected in FIGS. 8a-8d, frequency range split and frequency domain average techniques further reduce the noise in the results. Thus, in embodiments in which all the techniques are applied, good result are achieved even with 0 dB SNR.

Figure 9A:
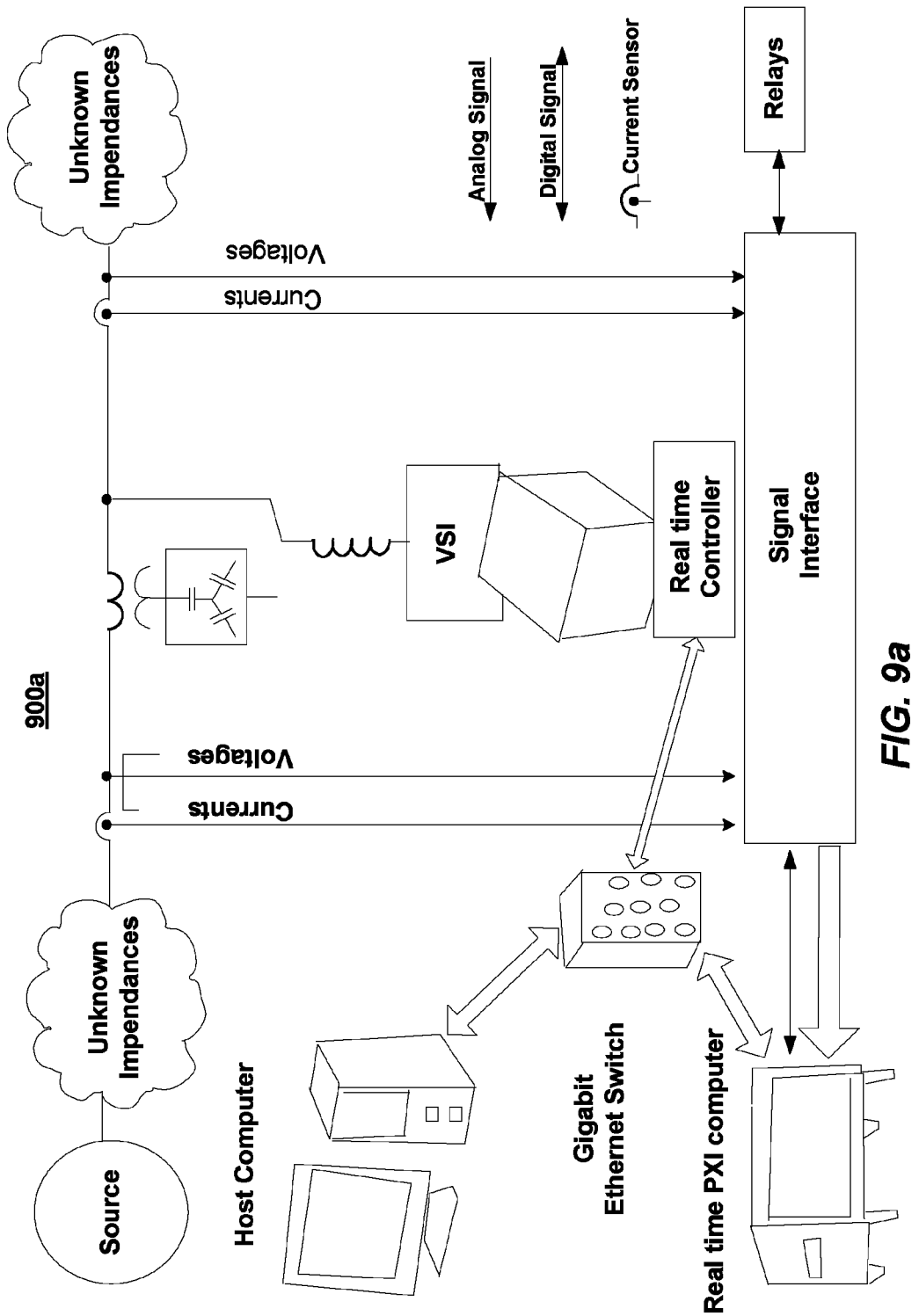
FIG. 9a is a block diagram illustrating an example impedance measurement system, consistent with certain disclosed embodiments.
Figure 9B:
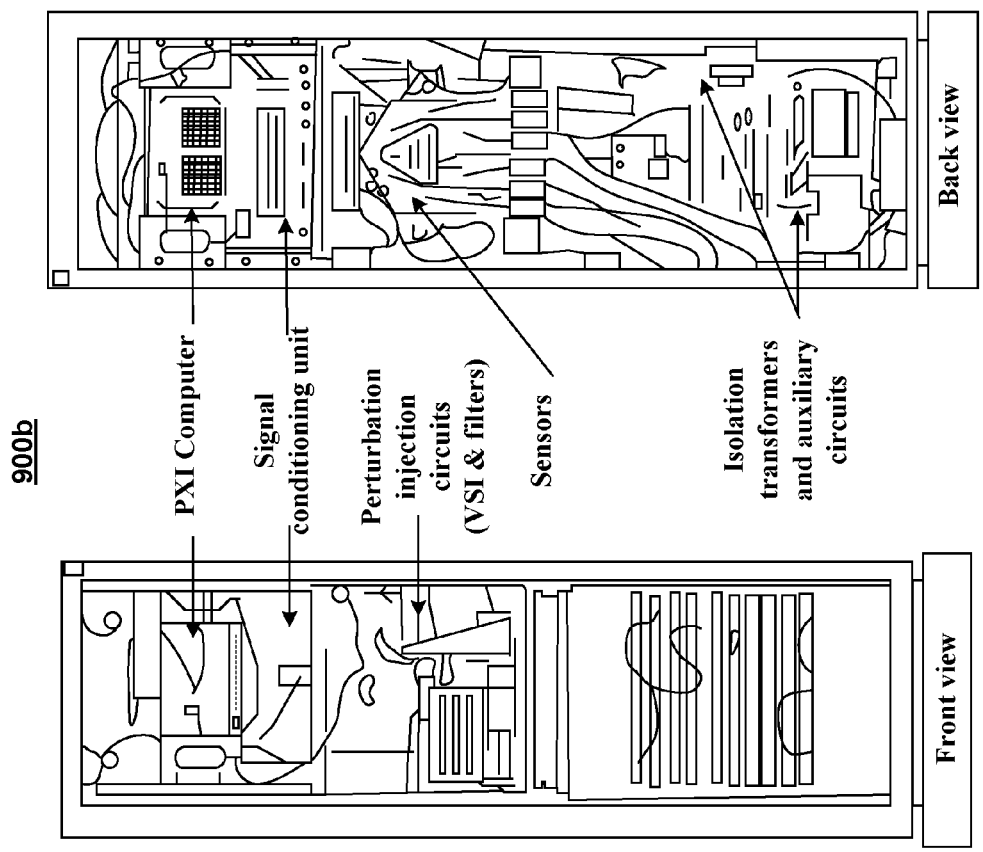
FIG. 9b illustrates an example impedance measurement system, consistent with certain disclosed embodiments.

FIGS. 9a and 9b illustrate example impedance measurement components. FIG. 9a is a block diagram illustrating an example impedance measurement system 900a, consistent with certain disclosed embodiments. FIG. 9b is an example of an impedance measurement unit (IMU) 900b, consistent with certain disclosed embodiments. In some embodiments, IMU 900b illustrated in FIG. 9b may be used in connection with the impedance measurement system illustrated in FIG. 9a. In FIG. 9b, IMU 900b may be configured to use a three-phase Voltage Source Inverter (VSI) to create perturbations and a PXI computer to acquire the response. As understood by one of ordinary skill in the art, a PXI computer is a PCI eXtensions for Instrumentation platform. The data captured by the PXI computer of FIG. 9b may be stored and post-processed by a host computer. In some embodiments, the host computer may be connected remotely to the IMU.

In some embodiments, IMU 900b of FIG. 9b may be configured to perform three primary tasks. The first task, which may be implemented using an injection circuit, may include setting and creating current and/or voltage perturbations in the system. This task may implemented by, for example, connecting the VSI into the system either in series, if voltage is injected, or in shunt, if current is injected. The second task, which may be implemented using a collection circuit, may include measuring the responses at the interface. For example, sensors at the interface may convert the responses into low-level analog signals. The low-level analog signal may be first processed by analog circuits then converted into digital signals by the PXI computer. The signals may then transferred from abc coordinates into dq coordinates using the phase information provided by the Phase Locked Loop (PLL) running real time in the PXI computer. The third task, which may be implemented by a control circuit, may include calculating the impedance matrix, as discussed above in connection with Equations (4), (5), (6), and (7). In some embodiments, the third task may be performed on a host computer, which may be configured to collect digital signals from the PXI computer. The host computer may also perform several auxiliary tasks, such as controlling the measurement control unit and interacting with the user. In certain embodiments, the host computer may run the measurement control unit and the user interface unit may be connected remotely through a high-speed wired connection, such as, for example, Ethernet, or wireless connection, such as, for example, Wi-Fi, Bluetooth, etc.

The injection circuit, collection circuit, and control unit of IMU 900b illustrated in FIG. 9b may each include one or more of the following components: at least one central processing unit (CPU) configured to execute computer program instructions to perform various processes and methods, random access memory (RAM) and read only memory (ROM) configured to access and store data and information and computer program instructions, I/O devices configured to provide input and/or output to the IMU (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium), where the files that comprise an operating system, application programs including, for example, web browser application, email application and/or other applications, and data files are stored.

In addition, IMU 900b can include antennas, network interfaces that provide wireless and/or wire line digital and/or analog interface to one or more networks, a power source that provides an appropriate alternating current (AC) or direct current (DC) to power one or more components of IMU 900b, and a bus that allows communication among the various disclosed components of IMU 900b of FIG. 9b. Each of these components is well-known in the art and will not be discussed further.

Although not shown, IMU 900b can also include one or more mechanisms and/or devices by which IMU 900b can perform the methods as described herein. For example, IMU 900b can include one or more encoders, one or more decoders, one or more interleavers, one or more circular buffers, one or more multiplexers, one or more de-multiplexers, one or more permuters, one or more decryption units, one or more demodulation units, one or more arithmetic logic units and/or their constituent parts, etc. These mechanisms and/or devices can include any combination of hardware and/or software components and can be included, in whole or in part, in any of the components shown in FIG. 9b.

In one or more exemplary designs of IMU 900b, the functions described can be implemented in hardware, software, firmware, or any combination thereof. If implemented in software, the functions can be stored as one or more instructions or code on computer-readable medium, including the computer-readable medium described above (e.g., RAM, ROM, and storage media).

Figure 10:
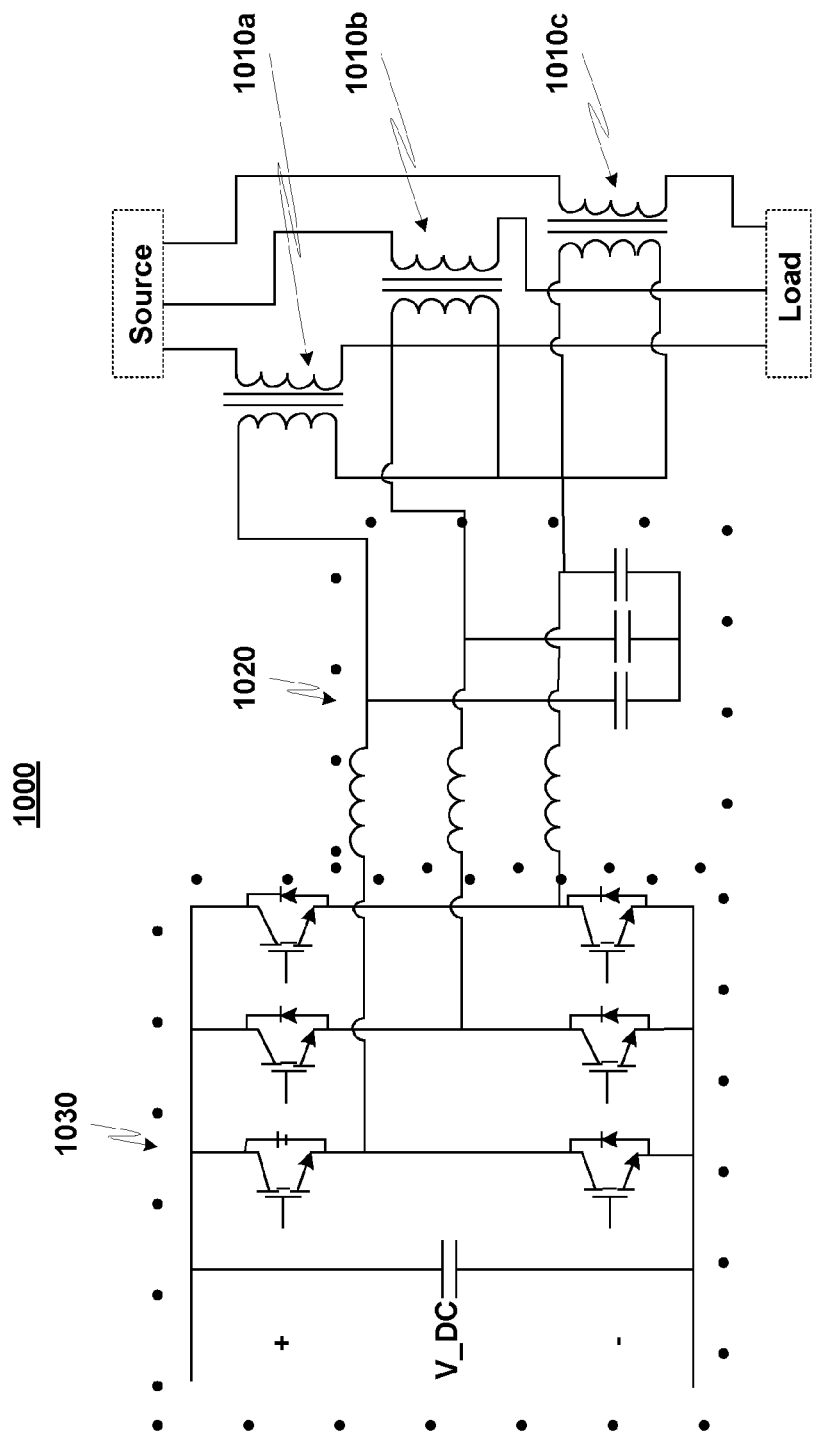
FIG. 10 schematically illustrates an example injection circuit, consistent with certain disclosed embodiments.
Figure 11A:
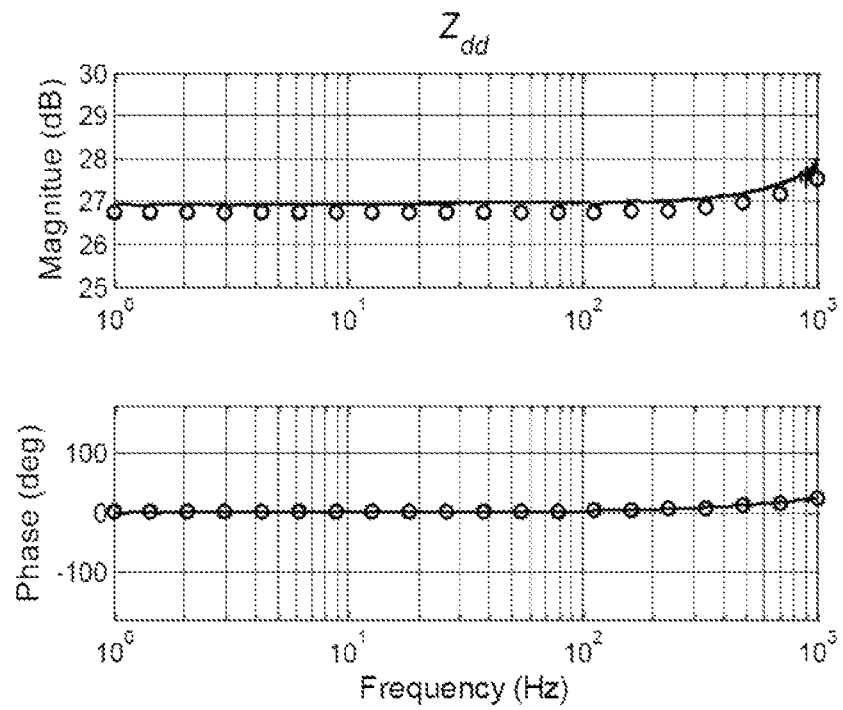
FIG. 11a graphically illustrates an example extracted impedance of a three-phase R-L load, consistent with certain disclosed embodiments.
Figure 11B:
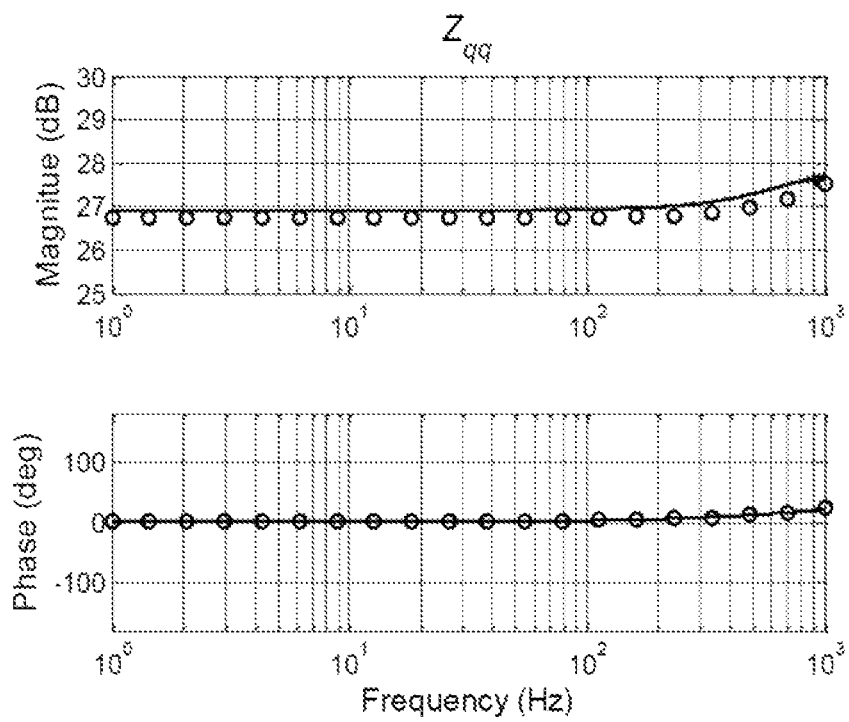
FIG. 11b graphically illustrates an example extracted impedance of a three-phase R-L load, consistent with certain disclosed embodiments.
Figure 11C:
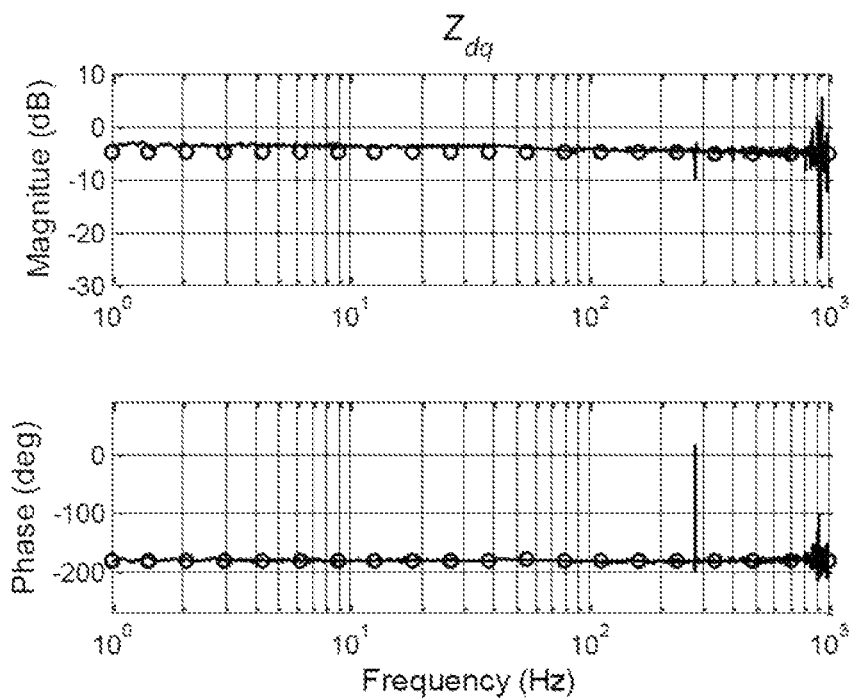
FIG. 11c graphically illustrates an example extracted impedance of a three-phase R-L load, consistent with certain disclosed embodiments.
Figure 11D:
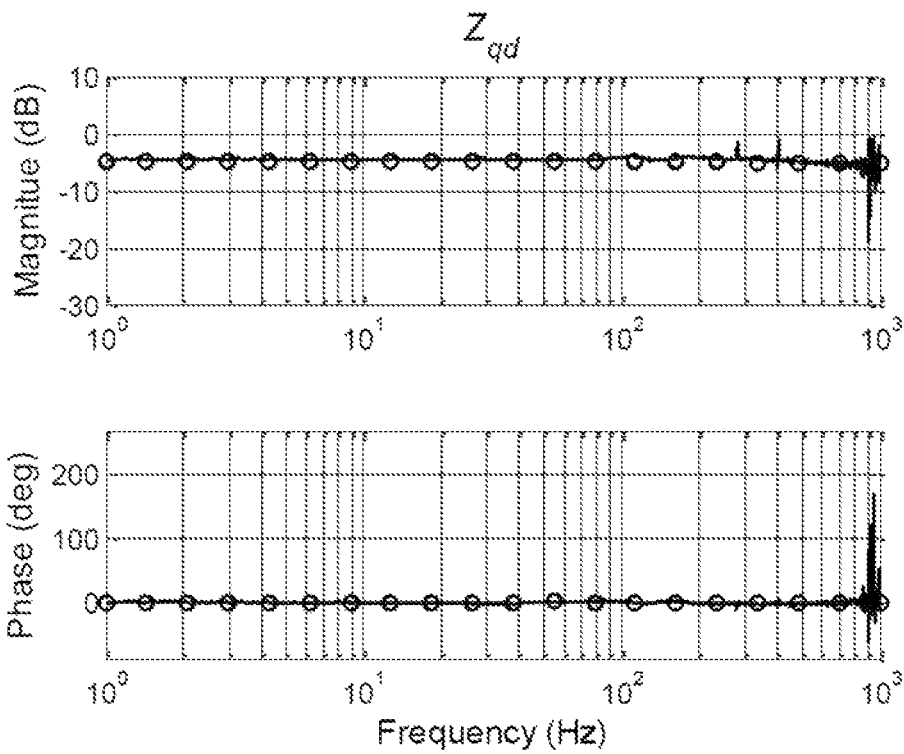
FIG. 11d graphically illustrates an example extracted impedance of a three-phase R-L load, consistent with certain disclosed embodiments.
Figure 12A:
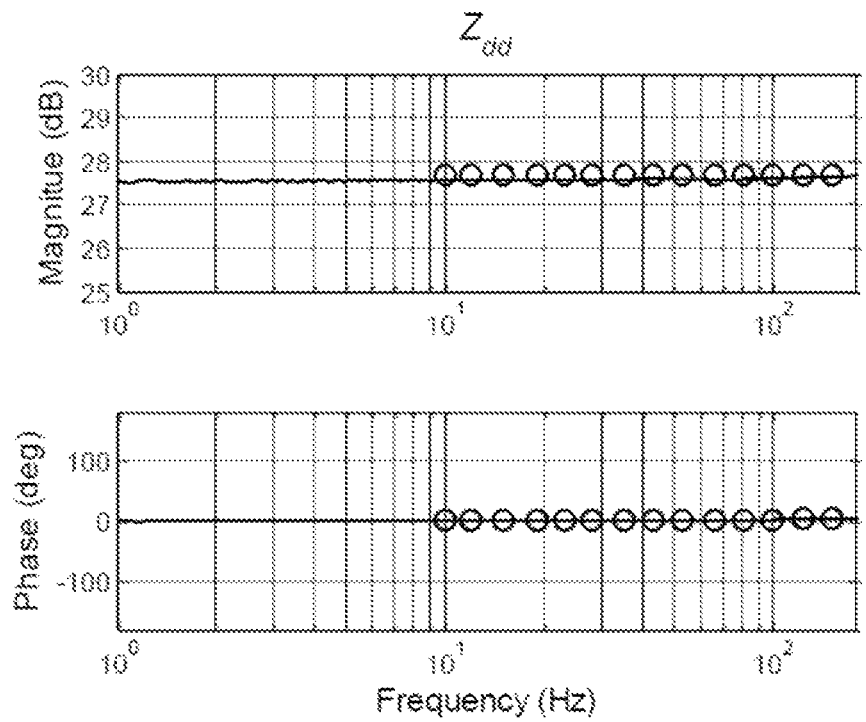
FIG. 12a graphically illustrates an example extracted impedance of an input impedance of a diode rectifier, consistent with certain disclosed embodiments.
Figure 12B:
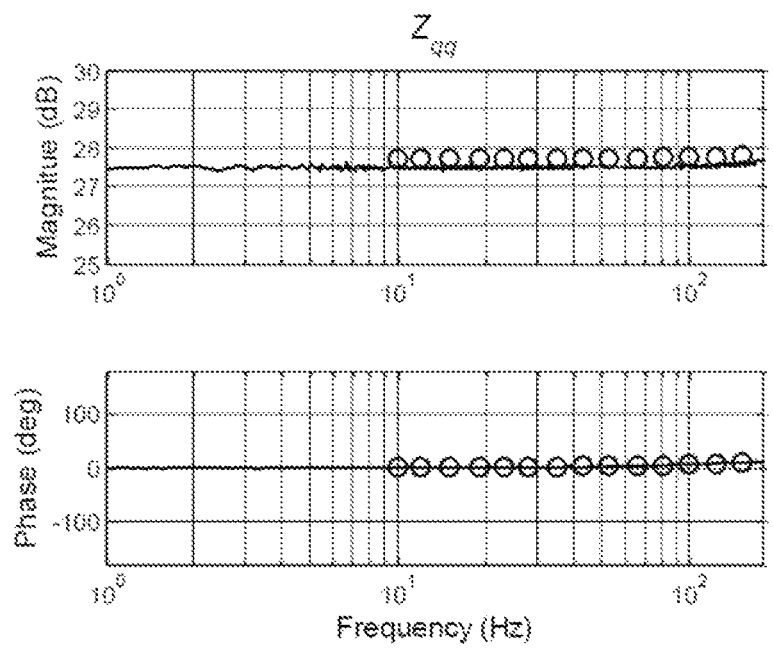
FIG. 12b graphically illustrates an example extracted impedance of an input impedance of a diode rectifier, consistent with certain disclosed embodiments.
Figure 12C:
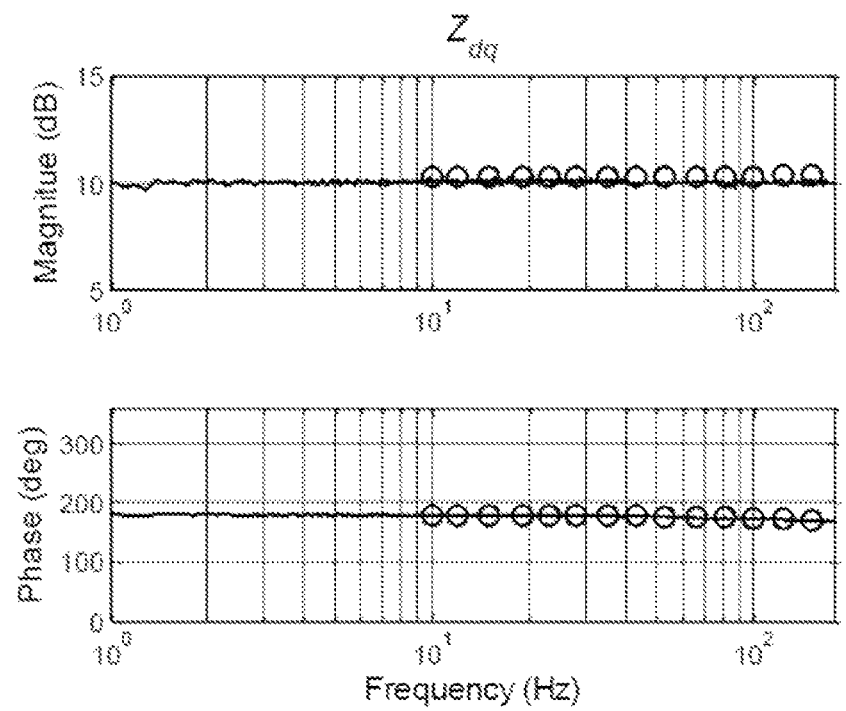
FIG. 12c graphically illustrates an example extracted impedance of an input impedance of a diode rectifier, consistent with certain disclosed embodiments.
Figure 12D:
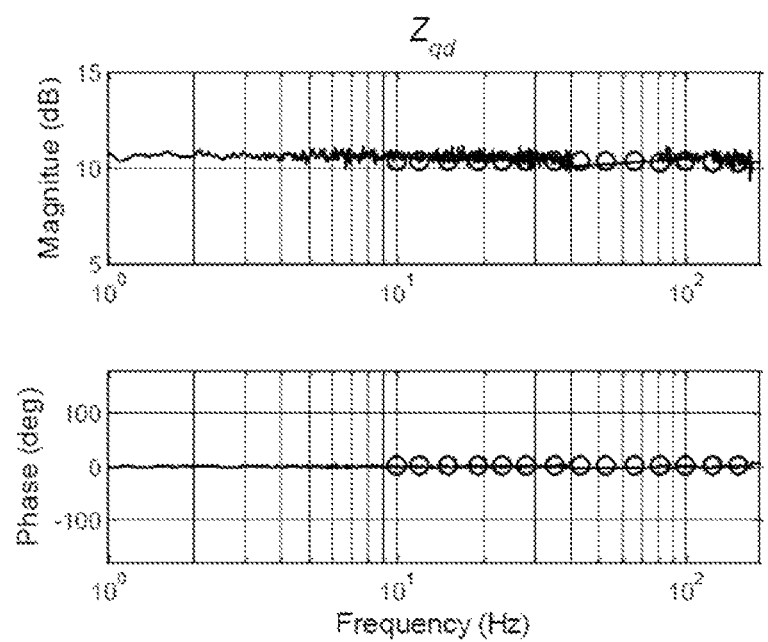
FIG. 12d graphically illustrates an example extracted impedance of an input impedance of a diode rectifier, consistent with certain disclosed embodiments.

FIG. 10 schematically illustrates an example injection circuit 1000, consistent with certain disclosed embodiments. To inject the voltage disturbances, such as the voltage disturbances reflected in FIG. 7, the output of the VSI in the IMU is isolated by three transformers 1010, such as, for example, transformer 1010a, transformer 1010b, and transformer 1010c, as shown in FIG. 10. The VSI controller may be configured to run in an open-loop.

In FIG. 10, the output may be filtered by an L-C filter stage, such as, for example, L-C filter stage 1020, and then planed in series through transformers 1010. A DC voltage controller such as, for example, DC voltage controller 1030, having a very low control bandwidth may supply the converter from the system to be measured. Since no active power is injected into the system, the energy consumption of the converter is only the loss of the circuit. Therefore, the operating point of the system is not affected by the injection circuit.

In embodiments, the bandwidth of one injection of a chirp signal may be limited to enhance the SNR. For example, one group of chirp signal injections may be set to measure the frequency range between two adjacent harmonics of the system fundamental frequency, where the frequency range is selected to skip the harmonic frequencies. Although the limiting bandwidth and the average technique may produce good measurement at most frequency points, the power at some of the system harmonic frequencies may be large compared to the injection signal level. Thus, it may not be possible to obtain a high SNR at these points while keeping the system at the same operating point. Therefore, in some embodiments, the harmonic frequencies and the adjacent frequency ranges may be skipped. Because impedances of a system are considered to not change rapidly over the frequency range, interpolation from the measured points can be used when the impedances at the skipped frequencies are desired.

FIGS. 11a-11d graphically illustrate example extracted impedances of a three-phase R-L load, consistent with certain disclosed embodiments. That is, FIGS. 11a-11d illustrate a simulation setup used to verify the performance of disclosed embodiments. In FIGS. 11a-11d, the source-side impedances may be different from simulation source-side impedances, since they come from the internal impedance of a power supply and parasitic values of the wires. The load bank is specified as the values used in the simulation circuit. In FIGS. 11a-11d the graphed solid lines represent a proposed approach, whereas the circles represent a phase-by-phase offline measurement of the impedance of the load bank, as points of comparison. The obtained impedances are transferred into the dq coordinate system to allow for comparison with other measured results.

FIGS. 12a-12d graphically illustrate example extracted impedances of an input impedance of a diode rectifier, consistent with certain disclosed embodiments. In FIGS. 12a-12d, a nonlinear load is applied and a diode bridge is measured. The obtained measurement results of FIGS. 12a-12d are compared with impedances extracted from a switching model using a sinusoidal injection AC sweep algorithm.

As reflected in the disclosed embodiments, a chirp signal may be used as an excitation signal in three-phase AC impedance measurements in synchronous coordinates. As a wide bandwidth signal, the chirp signal measures the impedances at all frequencies of interest at once to reduce possible system state change during measurement. Compared to other wide bandwidth signals, the chirp signal has a flat, band width, controlled spectrum and a low crest factor. The various embodiments of the disclosed system and methods significantly reduce the measurement time and improve measurement accuracy.

The disclosed embodiments include systems and methods for extracting electric power system impedances while the power system is energized (online) and operating at various loading levels ranging from no-load to full-load. Specifically, the disclosed embodiments include the use of a chirp signal when injecting perturbations to perform impedance measurements at Alternating Current (AC) power system interfaces. The use a chirp signal and, in one example, a wide band linear chirp signal, for perturbation injection takes advantage of much shorter measuring times which results in increased measurement accuracy. The use of a wide band linear chirp signal significantly reduces the measurement time by injecting all frequencies of interest at the same time. This results in the advantage of improved measurement accuracy since frequency drift during the impedance measurement strongly affects accuracy. In contrast, the frequency sweep Fast Fourier Transform (FFT) and load step methods take significantly longer time and may not be practical in systems where the operating point cannot be maintained for a sufficient length of time.

The identification and subsequent measurement of source and load impedances are useful tools for assessing and evaluating stability of electrical power systems. Stability can be assessed by frequency domain analysis of the "minor loop gain" transfer function, which is defined as the $Z_S/Z_L$ impedance ratio. In order to measure source and load impedance at an AC electrical system interface, a perturbation is injected in the direct and quadrature (dq) reference frame. The voltage and current response to the perturbation are then measured. This measured data is post processed to obtain the spectra of the voltages and currents which are then used to calculate $Z_S$ and $Z_L$.

While the foregoing written description of the invention enables one of ordinary skill to make and use what is considered presently to be the best mode thereof, those of ordinary skill will understand and appreciate the existence of variations, combinations, and equivalents of particular disclosed embodiments, systems, methods. The invention should therefore not be limited by the described embodiments, but by all embodiments and methods within the scope and spirit of the invention.

What is claimed is:

1. A method of impedance measurement for a three-phase alternating current (AC) system, comprising:
   connecting an injection circuit of an impedance measurement unit to the three-phase AC system, the injection circuit comprising a voltage source inverter configured for drawing power from the three-phase AC system to charge a capacitor and for using discharged power from the capacitor to inject chirp signals into the three-phase AC system;
   injecting by the injection circuit at least one chirp signal into the three-phase AC system;
   collecting by a collection circuit of the impedance measurement unit at least one response to the at least one chirp signal;
   transferring by an instrumentation platform computer the at least one response from three-phase (abc) coordinates to direct and quadrature (dq) coordinates; and
   calculating by a control circuit at least one impedance of the three-phase AC system based on the at least one response to the at least one chirp signal.

2. The method of claim 1, wherein the at least one chirp signal includes one of the set consisting of a d-axis chirp signal and a q-axis chirp signal.

3. The method of claim 1, wherein the at least one chirp signal includes a d-axis chirp signal and a q-axis chirp signal.

4. The method of claim 3, wherein at least one of the d-axis chirp signal and the q-axis chirp signal is of the form:

$$x(t) = \sin\left(2\pi\left(f_0 + \frac{f_1 - f_0}{2T}t\right)t\right),$$

where $f_0$ is a start frequency, $f_1$ is an end frequency, T is a duration of at least one of the d-axis chirp signal and the q-axis chirp signal, and t is a time.

5. The method of claim 1, wherein the action of transferring the at least one response from abc coordinates to dq coordinates comprises:
   transforming an AC voltage response to direct current (DC) voltage components; and transforming an AC current response to DC current components.

6. The method of claim 1, wherein the action of calculating the impedances of the three-phase AC system comprises:
identifying frequency points of interest; and
calculating impedance at each frequency point of interest.

7. The method of claim 1, further comprising:
generating a virtual perturbation signal through an injection transfer function matrix; and
collecting a response to the virtual perturbation signal, wherein the action of calculating at least one impedance includes calculating an impedance based on the response to the virtual perturbation signal and the at least one response to the at least one chirp signal.

8. The method of claim 7, wherein the action of generating a virtual perturbation signal through an injection transfer function matrix comprises:
generating the virtual perturbation signal using the equation $$G_{inj}(s) = \begin{bmatrix} G_{injd}(s) \\ G_{injq}(s) \end{bmatrix},$$

where $G_{inj}(s)$ is the injection transfer function matrix, $G_{injd}(s)$ is a d-axis injection transfer function, and $G_{injq}(s)$ is a q-axis injection transfer function.

9. The method of claim 8, wherein the action of generating a virtual perturbation signal through an injection transfer function matrix comprises:
generating two independent perturbation signals using the equations $$G_{inj1}(s)=[A_1\ B_1]^T,\ G_{inj2}(s)=[A_2\ B_2]^T,$$

where $G_{inj1}(s)$ is a first injection transfer function matrix, $G_{inj2}(s)$ is a second injection transfer function matrix, $G_{inj1}$ is a first transfer function, $G_{inj2}$ is a second transfer function, $A_1$ is a first element in the transfer function $G_{inj1}$, $A_2$ is a first element in the transfer function $G_{inj2}$, $B_1$ is a second element in the transfer function $G_{inj1}$, $B_2$ is a second element in the transfer function $G_{inj2}$, and T is a transpose symbol.

10. The method of claim 9, wherein matrices $[A_1\ B_1]^T$ and $[A_2\ B_2]^T$ are vectors.

11. The method of claim 10, wherein the matrices $[A_1\ B_1]^T$ and $[A_2\ B_2]^T$ are independent and constant vectors.

12. A system for performing impedance measurement for a three-phase alternating current (AC) system, comprising:
an injection circuit comprising a voltage source inverter (VSI) connectable to the three-phase AC system and a capacitor, the VSI being configured for drawing power from the three-phase AC system to charge the capacitor and for using discharged power from the capacitor to inject at least one chirp signal into the three-phase AC system;
a collection circuit configured to collect at least one response to the at least one chirp signal;
a control unit configured to transfer the at least one response from three-phase (abc) coordinates to direct and quadrature (dq) coordinates and to calculate at least one impedance of the three-phase AC system based on the at least one response to the at least one chirp signal.

13. The system of claim 12, wherein the injection circuit is configured to inject at least one of the set consisting of a d-axis chirp signal and a q-axis chirp signal into the three-phase AC system.

14. The system of claim 13, wherein when the injection circuit is configured to inject a d-axis chirp signal and a q-axis chirp signal into the three-phase AC system.

15. The system of claim 14, wherein at least one of the d-axis chirp signal and the q-axis chirp signal is of the form:

$$x(t) = \sin\left(2\pi\left(f_0 + \frac{f_1 - f_0}{2T}t\right)t\right),$$

where $f_0$ is a start frequency, $f_1$ is an end frequency, T is a duration of at least one of the d-axis chirp signal and the q-axis chirp signal, and t is a time.

16. The system of claim 12, wherein the control unit is configured to transform an AC voltage response to direct current (DC) voltage components and transform an AC current response to DC current components.

17. The system of claim 12, wherein the control unit is configured to identify frequency points of interest and calculate impedance at each frequency point of interest.

18. The system of claim 12, wherein:
the injection circuit is further configured to generate a virtual perturbation signal through an injection transfer function matrix;
the collection circuit is further configured to collect a response to the virtual perturbation signal; and
the control unit is further configured to calculate an impedance based on the response to the virtual perturbation signal and the at least one response to the at least one chirp signal.

19. The system of claim 18, wherein the injection circuit is configured to generate the virtual perturbation signal using the equation $$G_{inj}(s) = \begin{bmatrix} G_{injd}(s) \\ G_{injq}(s) \end{bmatrix},$$

where $G_{inj}(s)$ is the injection transfer function matrix, $G_{injd}(S)$ is a d-axis injection transfer function, and $G_{injq}(s)$ is a q-axis injection transfer function.

20. The system of claim 19, wherein the injection circuit is configured to generate two independent perturbation signals using the equations $$G_{inj1}(s)=[A_1\ B_1]^T,\ G_{inj2}(s)=[A_2\ B_2]^T,$$

where $G_{inj1}(s)$ is a first injection transfer function matrix, $G_{inj2}(s)$ is a second injection transfer function matrix, $G_{inj1}$ is a first transfer function, $G_{inj2}$ is a second transfer function, $A_1$ is a first element in the transfer function $G_{inj1}$, $A_2$ is a first element in the transfer function $G_{inj2}$, $B_1$ is a second element in the transfer function $G_{inj1}$, $B_2$ is a second element in the transfer function $G_{inj2}$, and T is a transpose symbol.

21. The system of claim 20, wherein matrices $[A_1\ B_1]^T$ and $[A_2\ B_2]^T$ are independent and constant vectors.

22. The system of claim 12 wherein the injection circuit further comprises, for each phase of the three-phase AC system, an L-C filter and a transformer connected in series between the VSI and the three-phase AC system.

* * * * *